(12) United States Patent
Chen et al.

(10) Patent No.: US 9,459,319 B2
(45) Date of Patent: Oct. 4, 2016

(54) DEVICE AND METHOD FOR GENERATING INPUT CONTROL SIGNALS OF A SERIALIZED COMPRESSED SCAN CIRCUIT

(71) Applicant: Industrial Technology Research Institute, Hsinchu (TW)

(72) Inventors: Chen-An Chen, Kaohsiung (TW); Yee-Wen Chen, Hsinchu (TW); Ming-Hsueh Wu, Kaohsiung (TW); Kun-Lun Luo, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 143 days.

(21) Appl. No.: 14/446,342

(22) Filed: Jul. 30, 2014

(65) Prior Publication Data

US 2015/0036783 A1 Feb. 5, 2015

(30) Foreign Application Priority Data

Jul. 30, 2013 (TW) .............................. 102127222 A

(51) Int. Cl.
*G01R 31/28* (2006.01)
*G06F 1/00* (2006.01)
(Continued)

(52) U.S. Cl.
CPC ... *G01R 31/318552* (2013.01); *G01R 31/3177* (2013.01); *G01R 31/31725* (2013.01); *G01R 31/318544* (2013.01)

(58) Field of Classification Search
CPC ............... G01R 31/318552; G01R 31/31725; G01R 31/3177; G06F 11/25
USPC ........ 714/731, 726, 734, 727, 733; 713/500, 713/600, 400
See application file for complete search history.

(56) References Cited

U.S. PATENT DOCUMENTS 7,558,151 B1 * 7/2009 Svoiski ............... G06F 13/4243
365/193
7,783,946 B2 * 8/2010 Parulkar .......... G01R 31/31853
714/726
(Continued)

FOREIGN PATENT DOCUMENTS

JP 2010-032507 2/2010
TW 179746 3/1992
(Continued)

OTHER PUBLICATIONS

Wang et al., "A New Solution to Implement Multi-Full-Scan-Chain Test with JTAG," Solid-State and Integrated Circuit Technology (ICSICT), Oct. 2006, pp. 2155-2157.
(Continued)

*Primary Examiner* — Christine Tu
(74) *Attorney, Agent, or Firm* — Jianq Chyun IP Office

(57) ABSTRACT

A device and a method for generating input control signals of a serialized compressed scan circuit are provided. A control signal generating device receives a test clock signal from a clock input port and a state enable signal from a state enable bus, and correspondingly generates a shift enable signal, a capture enable signal and a strobe signal. A clock gating device is coupled to the control signal generating device, and receives the shift enable signal, the capture enable signal and the strobe signal. When the shift enable signal is enabled, the clock gating device controls the test clock signal as a serialized scan clock signal. When the strobe signal or the capture enable signal is enabled, the clock gating device controls the test clock signal as a scan clock signal.

30 Claims, 24 Drawing Sheets

(51) Int. Cl.
  *G01R 31/3185* (2006.01)
  *G01R 31/317* (2006.01)
  *G01R 31/3177* (2006.01)

(56) References Cited

U.S. PATENT DOCUMENTS

| | | | |
|---|---|---|---|
| 7,831,877 B2* | 11/2010 | Sul | G01R 31/31859 714/729 |
| 8,108,742 B2 | 1/2012 | Whetsel | |
| 2010/0205490 A1 | 8/2010 | Louie et al. | |
| 2010/0318863 A1 | 12/2010 | Whetsel | |
| 2012/0117435 A1 | 5/2012 | Whetsel | |
| 2014/0208178 A1* | 7/2014 | Sunter | G01R 31/31857 714/731 |

FOREIGN PATENT DOCUMENTS

| | | |
|---|---|---|
| TW | 463094 | 11/2001 |
| TW | 586059 | 5/2004 |

OTHER PUBLICATIONS

Yi et al.,"Low-Cost Scan Test for IEEE-1500-Based SoC," IEEE Transactions on Instrumentation and Measurement, May 2008, pp. 1071-1078.

Stamenkovic et al., "Combining internal scan chains and boundary scan register: A case study," Eurocon May 2009, pp. 2064-2069.

Sabne et al., "A Generic Low Power Scan Chain Wrapper for Designs Using Scan Compression," VLSI Test Symposium, Apr. 2010, pp. 135-140.

Margulis et al., "Platform Independent Test Access Port Architecture," International Test Conference, Oct. 2008, p. 1.

Syed et al., "3D-Scalable Adaptive Scan (3D-SAS)," International 3D Systems Integration Conference (3DIC), Feb. 2012, pp. 1-6.

Lewis et al., "A Scan-Island Based Design Enabling Pre-bond Testability in Die-stacked Microprocessors," Proc. Intl Test Conf. (ITC), Oct. 2007, pp. 1-8.

Marinissen et al., "Testing 3D chips containing through-silicon vias," Proc. Int'l Test Conf. (ITC), Nov. 2009, pp. 1-11.

Lo et al., "SOC Test Architecture and Method for 3-D ICs," IEEE Trans. on Computer—Aided Design of Integrated Circuits and Systems, Oct. 2010, pp. 1645-1649.

Marinissen et al., "A structured and scalable test access architecture for TSV-based 3D stacked ICs," Proc. VLSI Test Symp. (VTS), Apr. 2010, pp. 269-274.

Marinissen et al., "3D DfT architecture for pre-bond and post-bond testing," Proc. 3D Systems Integration Conference (3DIC), Nov. 2010, pp. 1-8.

Chou et al., "A Test Integration Methodology for 3D Integrated Circuits," IEEE Asian Test Symp. (ATS), Dec. 2010, pp. 377-382.

Noia et al., "Test-architecture optimization for TSV-based 3D stacked ICs," Proc. European Test Symp. (ETS), May 2010, pp. 24-29.

Chi et al., "DfT Architecture for 3D-SICs with Multiple Towers," Proc. European Test Symp. (ETS), May 2011, pp. 51-56.

Office Action of Taiwan Counterpart Application, issued on Dec. 30, 2014, p. 1-p. 5.

* cited by examiner

DEVICE AND METHOD FOR GENERATING INPUT CONTROL SIGNALS OF A SERIALIZED COMPRESSED SCAN CIRCUIT

CROSS-REFERENCE TO RELATED APPLICATION

This application claims the priority benefit of Taiwan application serial no. 102127222, filed on Jul. 30, 2013. The entirety of the above-mentioned patent application is hereby incorporated by reference herein and made a part of this specification.

TECHNICAL FIELD

The disclosure relates to a device and a method for generating input control signals of a serialized compressed scan circuit.

BACKGROUND

More and more transistors are integrated in a single chip as the complexity of a circuit design growing, it not only increases the execution time of a scan test for a chip but also its test cost. Therefore, a serialized compressed scan architecture (SCSA) with a lot of scan chains but limited test inputs and outputs has been widely used in an integrated circuit (IC) as a design-for-testability (DFT) feature. By increasing the number of scan chains of a circuit, the scan chain length is decreased, which causes the testing time decreased. A test data compressed circuit is further used to reduce test data volume, so as to decrease the test cost. However, since a circuit design complied with a standard test interface has been widely implemented for test integration of an IC, it is difficult to directly implement the test integration of the ICs for the SCSA of a non-standard test interface.

SUMMARY

The present disclosure provides an integrated circuit device, configured to generate input control signals of a serialized compressed scan circuit. The integrated circuit device includes a clock input port, a state enable bus, a control signal generating device and a clock gating device. The clock input port is configured to receive a test clock signal. The state enable bus is configured to receive at least one state enable signal. The control signal generating device is configured to receive the state enable signal of the state enable bus and the test clock signal, and correspondingly generates a shift enable signal, a capture enable signal and a strobe signal. The clock gating device is coupled to the control signal generating device and receives the shift enable signal, the capture enable signal and the strobe signal. When the shift enable signal is enabled, the clock gating device controls the test clock signal as a serialized scan clock signal. When the strobe signal or the capture enable signal is enabled, the clock gating device controls the test clock signal as a scan clock signal. Wherein, the input control signals include the serialized scan clock signal and the scan clock signal.

The present disclosure provides a method for generating input control signals of a serialized compressed scan circuit. The method comprises: generating a shift enable signal, a capture enable signal and a strobe signal according to at least one state enable signal transmitted from a state enable bus and a test clock signal transmitted from a clock input port; controlling the test clock signal as a serialized scan clock signal when the shift enable signal is enabled; and controlling the test clock signal as a scan clock signal when the strobe signal or the capture enable signal is enabled. Wherein, the input control signals include the serialized scan clock signal and the scan clock signal.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
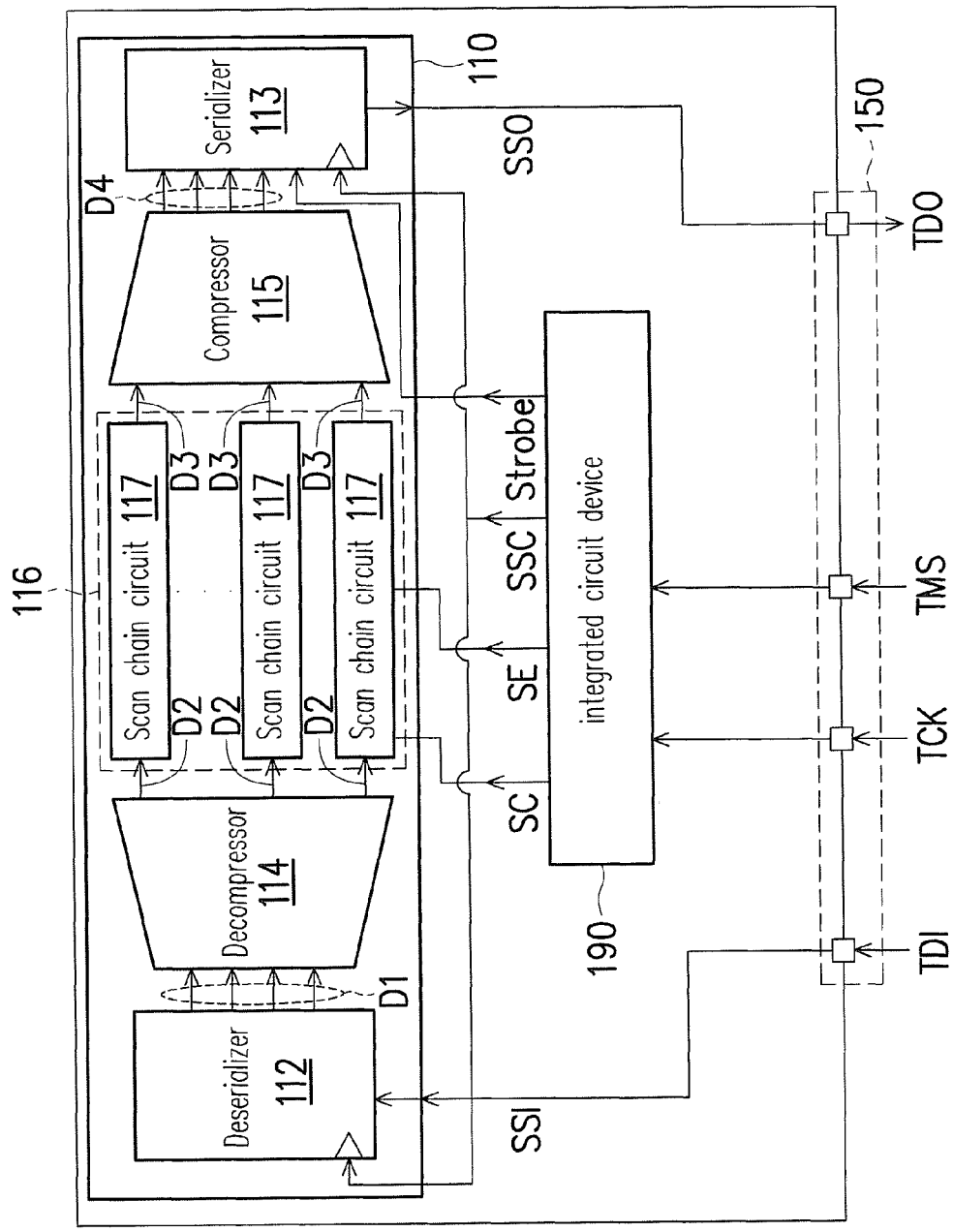
FIG. 1 illustrates an integrated circuit/chip according to an embodiment of the disclosure.

FIG. 1 illustrates an integrated circuit 100 according to an embodiment of the disclosure. The integrated circuit 100 includes a serialized compressed scan circuit 110, an integrated circuit device 190 and a test access port (TAP) 150. The integrated circuit 100 may be coupled to a test equipment (not shown) through the TAP 150, and receives a test data input signal TDI, a test clock signal TCK and a test mode selection signal TMS from the test equipment, and provides a test result data output signal TDO to the test equipment. The test data input signal TDI, the test clock signal TCK and the test mode selection signal TMS could be compliant to IEEE 1149.1 standard. The integrated circuit device 190 generates input control signals of the serialized compressed scan circuit 110. In the present embodiment, the input control signals of the serialized compressed scan circuit 110 include a shift enable signal SE, a strobe signal Strobe, a serialized scan clock signal SSC and a scan clock signal SC. The integrated circuit device 190 could control all or part of the test clock signal TCK as the serialized scan clock signal SSC. The integrated circuit device 190 could gate all or part of the test clock signal TCK as the scan clock signal SC. Moreover, the test data input signal TDI of the TAP 150 could be coupled to the serialized compressed scan circuit 110 to serve as a serialized scan data input signal SSI, and a serialized scan data output signal SSO of the serialized compressed scan circuit 110 could be serve as the test result data output signal TDO of the TAP 150.

In the present embodiment of FIG. 1, the serialized compressed scan circuit 110 includes a deserializer 112, a decompressor 114, circuits under test with parallel scan chains 116, a compressor 115 and a serializer 113, where the deserializer 112 could be a serial to parallel converter, and the serializer 113 could be a parallel to serial converter. The deserializer 112 converts the serially input (i.e. input in a serial mode) serialized scan data input signal SSI into data D1 having a plurality of bits according to the serialized scan clock signal SSC received from the integrated circuit device 190. In an embodiment, the serialized scan data input signal SSI could be compressed test data. The decompressor 114 decompresses the data D1 to generate a plurality of batches of data D2. The circuits under test with parallel scan chains 116 includes parallel scan chain (PSC) circuits 117, where when the scan test is performed, each of the PSC circuit 117 receives the data D2 according to the scan clock signal SC and the shift enable signal SE received from the integrated circuit device 190, and generates data D3 after the scan test. The operation of the PSC circuit 117 relates to a common digital integrated circuit scan test method. For example, each of the PSC circuits 117 receives one bit of the data D2 in response to the scan clock signal SC, i.e. the scan chain scan and shift one bit. The compressor 115 compresses a plurality batches of the data D3 received from the circuits under test with parallel scan chains 116 to generate data D4 having a plurality of bits. In an embodiment, the data D3 could be a test result, and the data D4 could be a compressed test result. Then, the serializer 113 converts the data D4 into the serialized scan data output signal SSO according to the serialized scan clock signal SSC and the strobe signal Strobe generated by the integrated circuit device 190. Therefore, the test equipment could determine whether the circuit under test (i.e. the integrated circuit 100) with parallel scan chains 116 is good or bad according to the test result data output signal TDO which is coupled to the serialized scan data output signal SSO.

Figure 2:
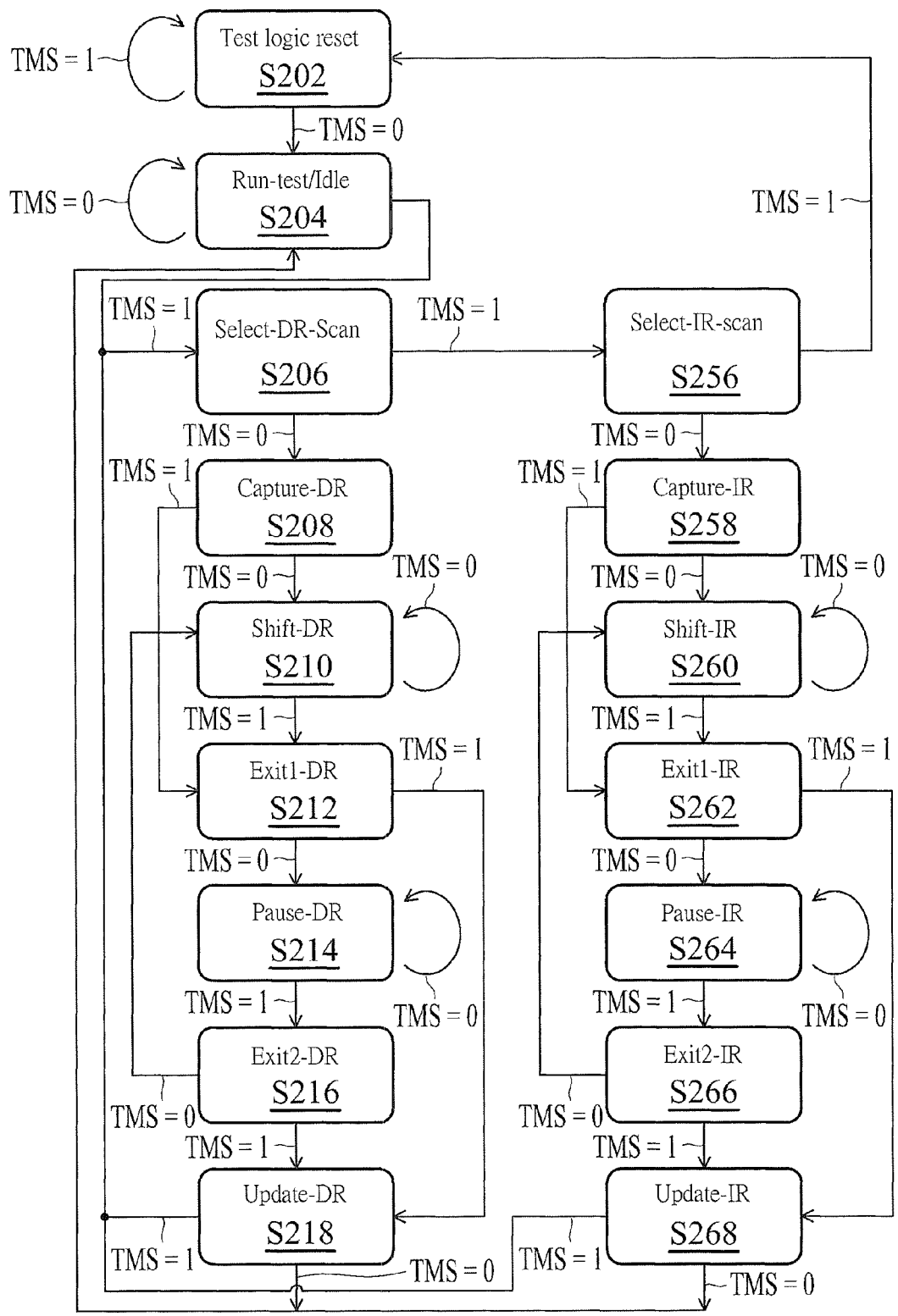
FIG. 2 is a state diagram of the integrated circuit device of FIG. 1 according to an embodiment of the disclosure.

FIG. 2 is a state diagram of the integrated circuit device 190 of FIG. 1 according to an embodiment of the disclosure, in which the state of the integrated circuit device 190 is compliant to the IEEE 1149.1 test standard. The integrated circuit device 190 could change its state value thereof according to the test mode selection signal TMS received from the TAP 150. Generally, a standard TAP state machine is composed of a 4-bit state register where a logic value of the state register represents the current state of the TAP state machine. First, the test mode selection signal TMS determines whether the TAP state machine of the integrated circuit device 190 remains in a test-logic-reset state S202 (TMS=1) or enters a run-test/idle state S204 (TMS=0). Under the test-logic-reset state S202 and the run-test/idle state S204, all of test data registers (for example, a bypass register, a boundary scan register, and user-defined data registers) are not activated. Then, when the test mode selection signal TMS is high (TMS=1), the integrated circuit device 190 enters a select-data-register-scan (select-DR-scan) state S206 from the run-test/idle state S204. Otherwise, the integrated circuit device 190 remains in the run-test/idle state S204. Thereafter, when the test mode selection signal TMS is low (TMS=0), the integrated circuit device 190 enters a capture-data-register (capture-DR) state S208 from the select-DR-scan state S206.

Then, when the test mode selection signal TMS is low, the integrated circuit device 190 enters a shift-data-register (shift-DR) state S210 from the capture-DR state S208. Otherwise, the integrated circuit device 190 enters an exit1-data-register (exit1-DR) state S212 from the capture-DR state S208.

When the integrated circuit device 190 is in the shift-DR state S210, if the test mode selection signal TMS is low, the integrated circuit device 190 remains in the shift-DR state S210. Otherwise (TMS=1), integrated circuit device 190 enters the exit1-DR state S212 from the shift-DR state S210.

When the integrated circuit device 190 is in the exit1-DR state S212, if the test mode selection signal TMS is low, the integrated circuit device 190 enters a pause-data-register (pause-DR) state S214 from the exit1-DR state S212. Otherwise (TMS=1), the integrated circuit device 190 enters the update-data-register (update-DR) state S218 from the exit1-DR state S212.

When the integrated circuit device 190 is in the pause-DR state S214, if the test mode selection signal TMS is low, the integrated circuit device 190 remains in the pause-DR state S214. Otherwise (TMS=1), the integrated circuit device 190 enters an exit2-data-register (exit2-DR) state S216 from the pause-DR state S214.

Then, when the test mode selection signal TMS is low, the integrated circuit device 190 returns to the shift-DR state S210 from the exit2-DR state S216. Otherwise (TMS=1), the integrated circuit device 190 enters the update-DR state S218 from the exit2-DR state S216. Then, when the test mode selection signal TMS is low, the integrated circuit device 190 returns to the run-test/idle state S204 from the update-DR state S218. Otherwise (TMS=1), the integrated circuit device 190 returns to the select-DR-scan state S206 from the update-DR state S218.

Moreover, when the integrated circuit device 190 is in the select-DR-scan state S206, and if the test mode selection signal TMS is high (TMS=1), the integrated circuit device 190 enters a select-instruction-register-scan (select-IR-scan) state S256 from the select-DR-scan state S206. Then, when the test mode selection signal TMS is high, the integrated circuit device 190 returns to the test-logic-reset state S202 from the select-IR-scan state S256. Conversely, when the test mode selection signal TMS is low, the integrated circuit device 190 enters a capture-instruction-register (capture-IR) state S258 from the select-IR-scan state S256. Then, when the test mode selection signal TMS is low, the integrated circuit device 190 enters a shift-instruction-register (shift-IR) state S260 from the capture-IR state S258. Otherwise (TMS=1), the integrated circuit device 190 enters an exit1-instruction-register (exit1-IR) state S262 from the capture-IR state S258.

When the integrated circuit device 190 is in the shift-IR state S260, if the test mode selection signal TMS is low, the integrated circuit device 190 remains in the shift-IR state S260. Otherwise (TMS=1), the integrated circuit device 190 enters the exit1-IR state S262 from the shift-IR state S260. When the integrated circuit device 190 is in the exit1-IR state S262, if the test mode selection signal TMS is low, the integrated circuit device 190 enters a pause-instruction-register (pause-IR) state S264 from the exit1-IR state S262. Otherwise (TMS=1), the integrated circuit device 190 enters an update-instruction-register (update-IR) state S268 from the exit1-IR state S262. When the integrated circuit device 190 is in the pause-IR state S264, if the test mode selection signal TMS is low, the integrated circuit device 190 remains in the pause-IR state S264. Otherwise (TMS=1), the integrated circuit device 190 enters an exit2-instruction-register (exit2-IR) state S266 from the pause-IR state S264. Then, when the test mode selection signal TMS is low, the integrated circuit device 190 returns to the shift-IR state S260 from the exit2-IR state S266. Otherwise (TMS=1), the integrated circuit device 190 enters the update-IR state S268 from the exit2-IR state S266. Thereafter, when the test mode selection signal TMS is low, the integrated circuit device 190 returns to the run-test/idle state S204 from the update-IR state S268. Otherwise (TMS=1), the integrated circuit device 190 returns to the select-DR-scan state S206 from the update-IR state S268.

Figure 3:
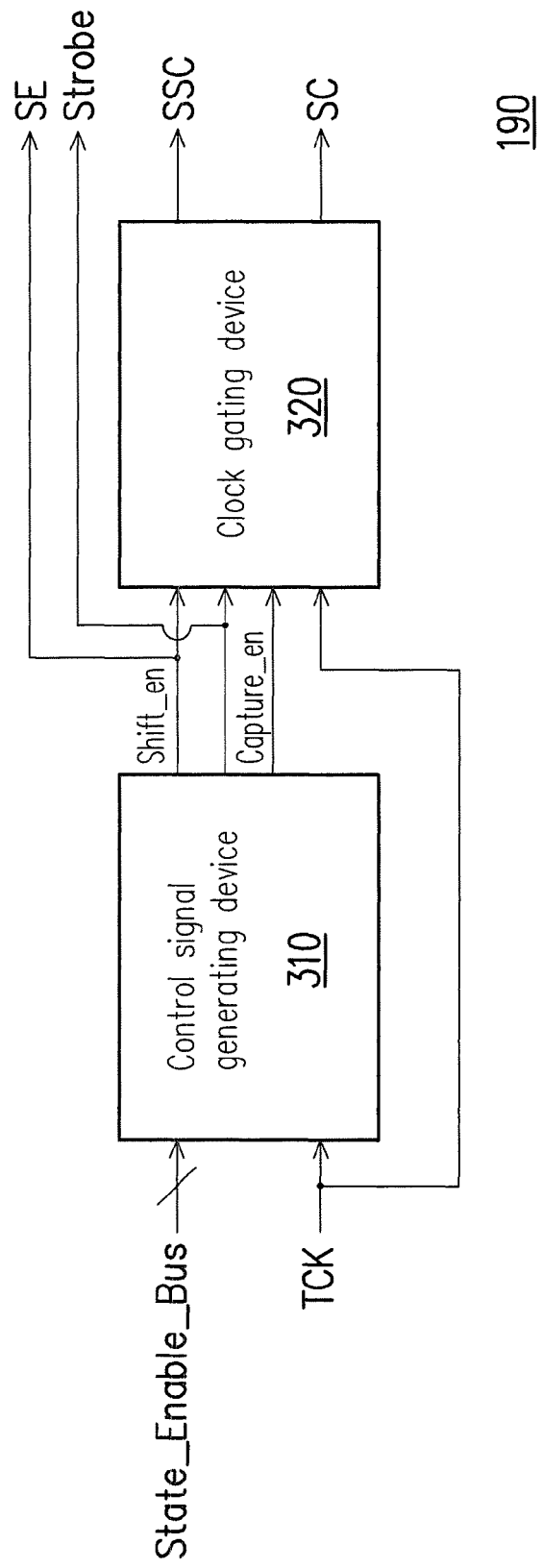
FIG. 3 illustrates the integrated circuit device of FIG. 1 according to an embodiment of the disclosure.

FIG. 3 illustrates the integrated circuit device 190 of FIG. 1 according to an embodiment of the disclosure. The integrated circuit device 190 includes a state enable bus State_Enable_Bus, a control signal generating device 310 and a clock gating device 320. The state enable bus State_Enable_Bus receives/transmits at least one state enable signal. The control signal generating device 310 is coupled to the state enable bus State_Enable_Bus for receiving the state enable signal. The control signal generating device 310 receives the test clock signal TCK, and correspondingly generates a shift enable signal Shift_en, a capture enable signal Capture_en and a strobe signal Strobe according to the state enable signals on the state enable bus State_Enable_Bus. In the present embodiment of FIG. 3, the shift enable signal Shift_en is outputted to the serialized compressed scan circuit 110 to serve as the shift enable signal SE.

The clock gating device 320 is coupled to the control signal generating device 310 for receiving the shift enable signal Shift_en, the capture enable signal Capture_en and the strobe signal Strobe. The clock gating device 320 receives and controls the test clock signal TCK as the serialized scan clock signal SSC when the shift enable signal Shift_en is enabled. The clock gating device 320 controls the test clock signal TCK as the scan clock signal SC when the strobe signal Strobe or the capture enable signal Capture_en is enabled.

Figure 4:
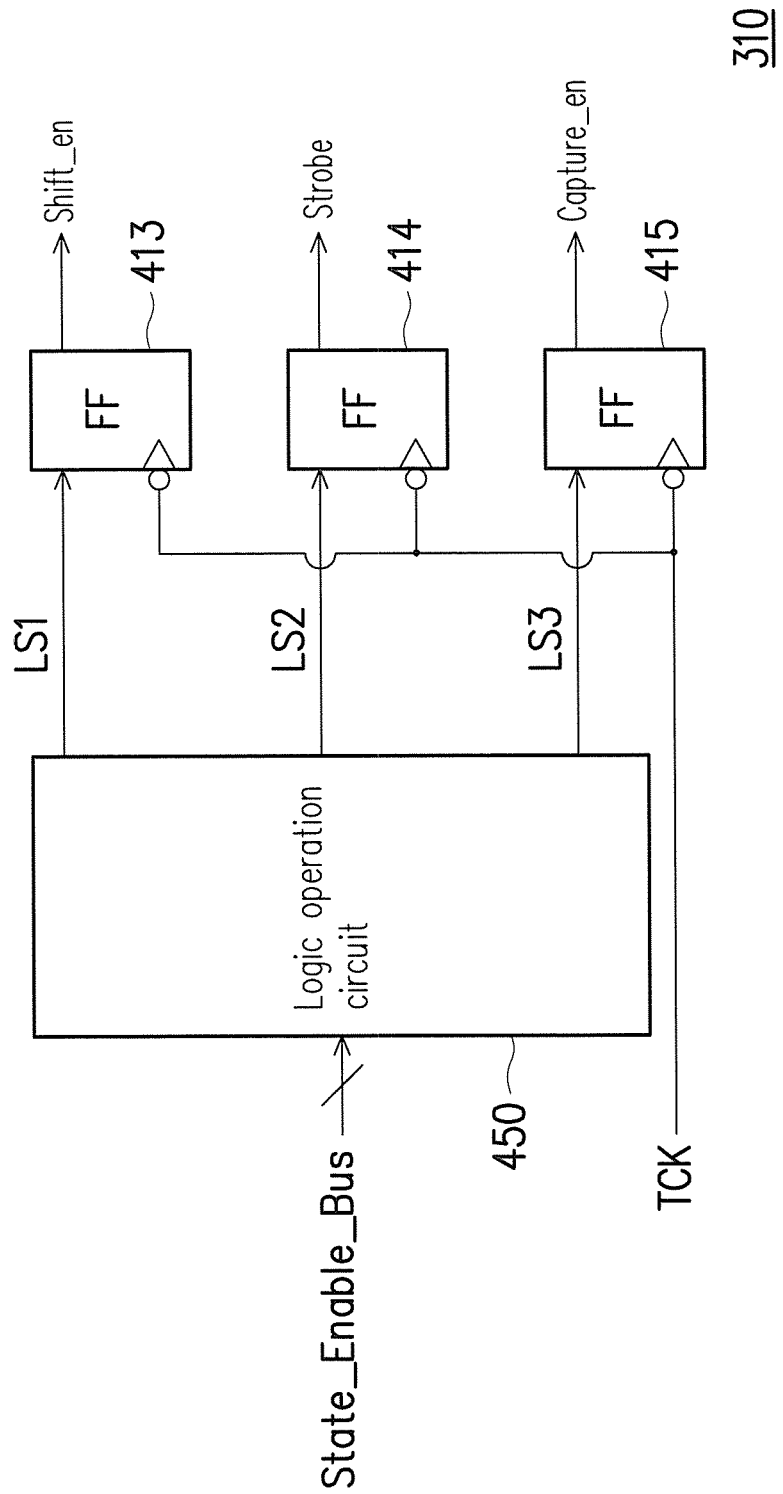
FIG. 4 illustrates the control signal generating device of FIG. 3 according to an embodiment of the disclosure.

FIG. 4 illustrates the control signal generating device 310 of FIG. 3 according to an embodiment of the disclosure. The control signal generating device 310 includes a logic operation circuit 450, a first negative edge-triggered register 413, a second negative edge-triggered register 414 and a third negative edge-triggered register 415. The logic operation circuit 450 is coupled to the state enable bus State_Enable_Bus for receiving the state enable signal. For example, the logic operation circuit 450 may receive an exit1-data-register (exit1-DR) state enable signal, an exit2-data-register (exit2-DR) state enable signal, a shift-data-register (shift-DR) state enable signal, a pause-data-register (pause-DR) state enable signal and/or a capture-data-register (capture-DR) state enable signal from the state enable bus State_Enable_Bus. According to the state enable signals of the state enable bus State_Enable_Bus, the logic operation circuit 450 correspondingly generating a first logic signal LS1, a second logic signal LS2 and a third logic signal LS3.

In the present embodiment of FIG. 4, the registers 413, 414 and 415 may be flip-flops (FFs). The input terminal of the first negative edge-triggered register 413 is coupled to the logic operation circuit 450 for receiving the first logic signal LS1. The negative edge-triggered terminal of the first negative edge-triggered register 413 is coupled to the test clock signal TCK. The output terminal of the first negative edge-triggered register 413 is coupled to the clock gating device 320 for providing the shift enable signal Shift_en. The input terminal of the second negative edge-triggered register 414 is coupled to the logic operation circuit 450 for receiving the second logic signal LS2. The negative edge-triggered terminal of the second negative edge-triggered register 414 is coupled to the test clock signal TCK. The output terminal of the second negative edge-triggered register 414 is coupled to the clock gating device 320 for providing the strobe signal Strobe. The input terminal of the third negative edge-triggered register 415 is coupled to the logic operation circuit 450 for receiving the third logic signal LS3. The negative edge-triggered terminal of the third negative edge-triggered register 415 is coupled to the test clock signal TCK. The output terminal of the third negative edge-triggered register 415 is coupled to the clock gating device 320 for providing the capture enable signal Capture_en.

In some embodiments, the logic operation circuit 450 may enable the first logic signal LS1 when the exit1-DR state enable signal Exit1-DR, the exit2-DR state enable signal Exit2-DR, the shift-DR state enable signal Shift-DR or the pause-DR state enable signal Pause-DR is enabled. The logic operation circuit 450 may enable the second logic signal LS2 when the exit1-DR state enable signal Exit1-DR or the exit2-DR state enable signal Exit2-DR is enabled. The logic operation circuit 450 may enable the third logic signal LS3 when the capture-DR state enable signal Capture-DR is enabled.

Figure 5:
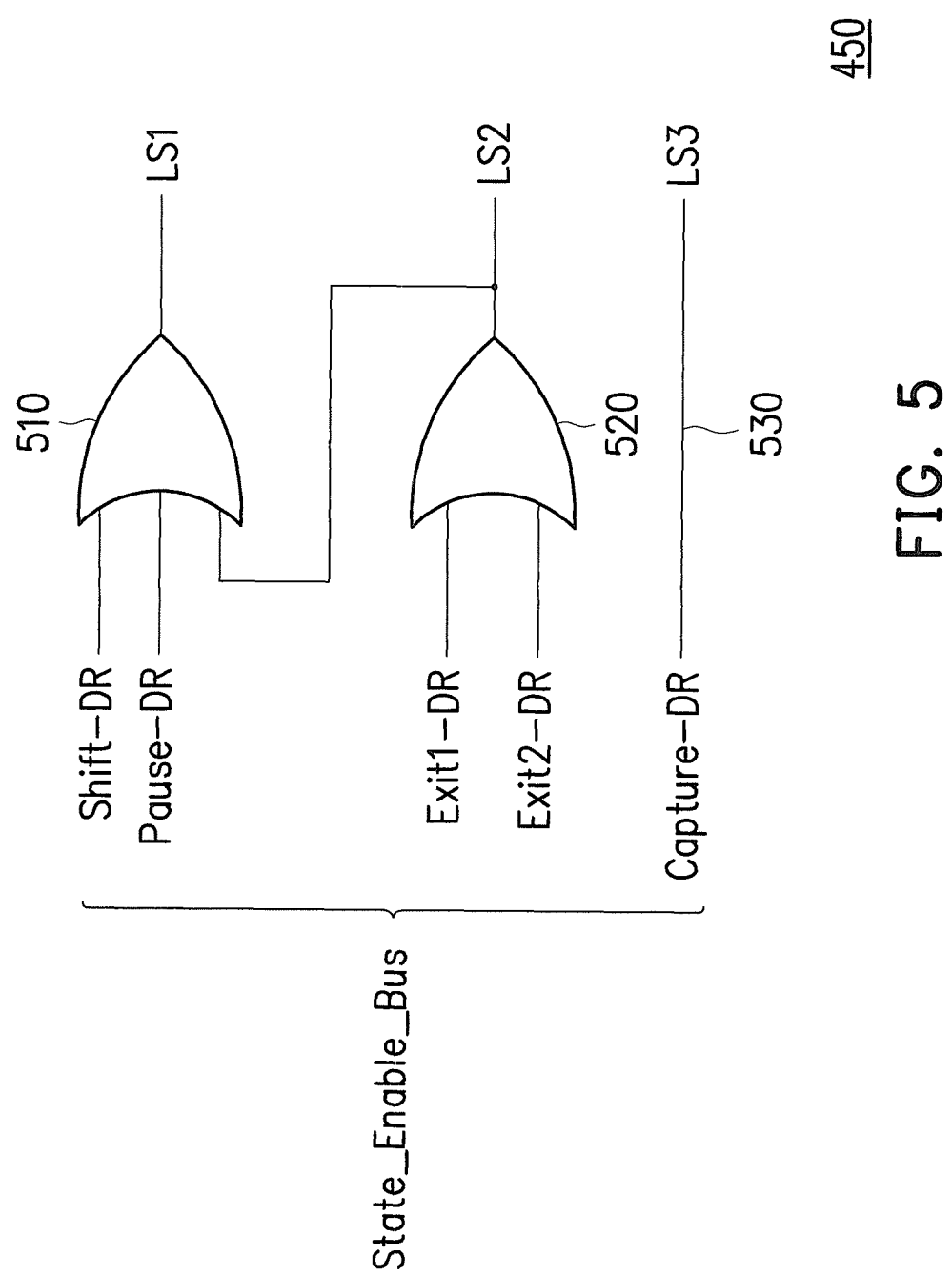
FIG. 5 illustrates the logic operation circuit of FIG. 4 according to an embodiment of the disclosure.

FIG. 5 illustrates the logic operation circuit 450 of FIG. 4 according to an embodiment of the disclosure. The logic operation circuit 450 includes an OR gate 510, an OR gate 520 and a wire 530. The first input terminal of the OR gate 510 is coupled to the state enable bus State_Enable_Bus for receiving the shift-DR state enable signal Shift-DR. The second input terminal of the OR gate 510 is coupled to the state enable bus State_Enable_Bus for receiving the pause-DR state enable signal Pause-DR. The output terminal of the OR gate 510 generates the first logic signal LS 1 to the input terminal of the first negative edge-triggered register 413. The first input terminal of the OR gate 520 is coupled to the state enable bus State_Enable_Bus for receiving the exit1-DR state enable signal Exit1-DR. The second input terminal of the OR gate 520 is coupled to the state enable bus State_Enable_Bus for receiving the exit2-DR state enable signal Exit2-DR. The output terminal of the OR gate 520 is coupled to the third input terminal of the OR gate 510 and the input terminal of the second negative edge-triggered register 414 for generating/providing the second logic signal LS2. The first terminal of the wire 530 is coupled to the state enable bus State_Enable_Bus for receiving the capture-DR state enable signal Capture-DR. The second terminal of the wire 530 outputs the capture-DR state enable signal Capture-DR to serve as the third logic signal LS3.

Figure 6:
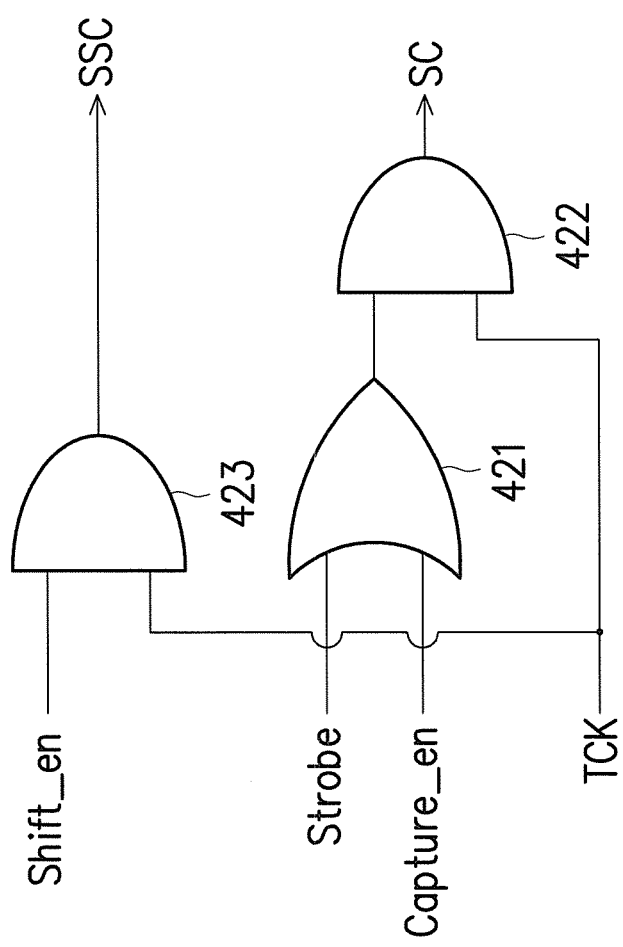
FIG. 6 illustrates the clock gating device of FIG. 3 according to another embodiment of the disclosure.

FIG. 6 illustrates the clock gating device 320 of FIG. 3 according to an embodiment of the disclosure. The clock gating device 320 includes an OR gate 421, a AND gate 422 and a AND gate 423. The first input terminal of the OR gate 421 is coupled to the control signal generating device 310 for receiving the signal Strobe. The second input terminal of the OR gate 421 is coupled to the control signal generating device 310 for receiving the signal Capture_en. The first input terminal of the AND gate 422 is coupled to the output terminal of the OR gate 421. The second input terminal of the AND gate 422 is coupled to the test clock signal TCK. The output terminal of the AND gate 422 generates the scan clock signal SC to the serialized compressed scan circuit 110. The first input terminal of the AND gate 423 is coupled to the control signal generating device 310 for receiving the shift enable signal shift_en. The second input terminal of the AND gate 423 is coupled to the test clock signal TCK. The output terminal of the AND gate 423 generates the serialized scan clock signal SSC to the serialized compressed scan circuit 110.

Figure 7:
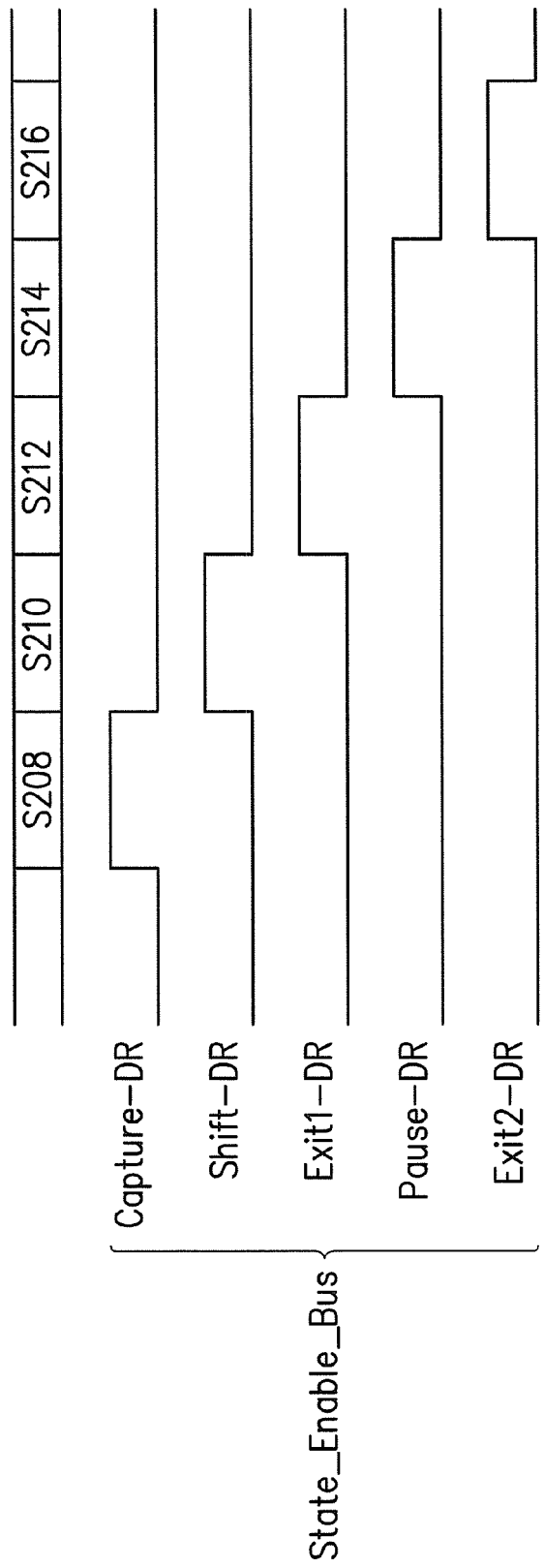
FIG. 7 is a state timing of the state enable bus State_Enable_Bus of an embodiment of the disclosure.

FIG. 7 is a state timing of the state enable bus State_Enable_Bus of an embodiment of the disclosure. Referring to FIG. 1, FIG. 2, and FIG. 7, when the integrated circuit device 190 enters the capture-DR state S208, the capture-DR state enable signal Capture-DR is transited from low to high, and the other state enable signals of the state enable bus State_Enable_Bus are still remained low. Then, when the integrated circuit device 190 enters the shift-DR state S210 from the capture-DR state S208, the capture-DR state enable signal Capture-DR is transited from high to low, and the shift-DR state enable signal Shift-DR is transited from low to high, and the others are deduced by analogy. In another embodiment, a polarity of the state enable bus State_Enable_Bus is reversed, namely, when the integrated circuit device 190 enters the capture-DR state S208, the capture-DR state enable signal Capture-DR is transited from high to low, and the other state enable signals are remained at high, and the others are deduced by analogy.

Figure 8:
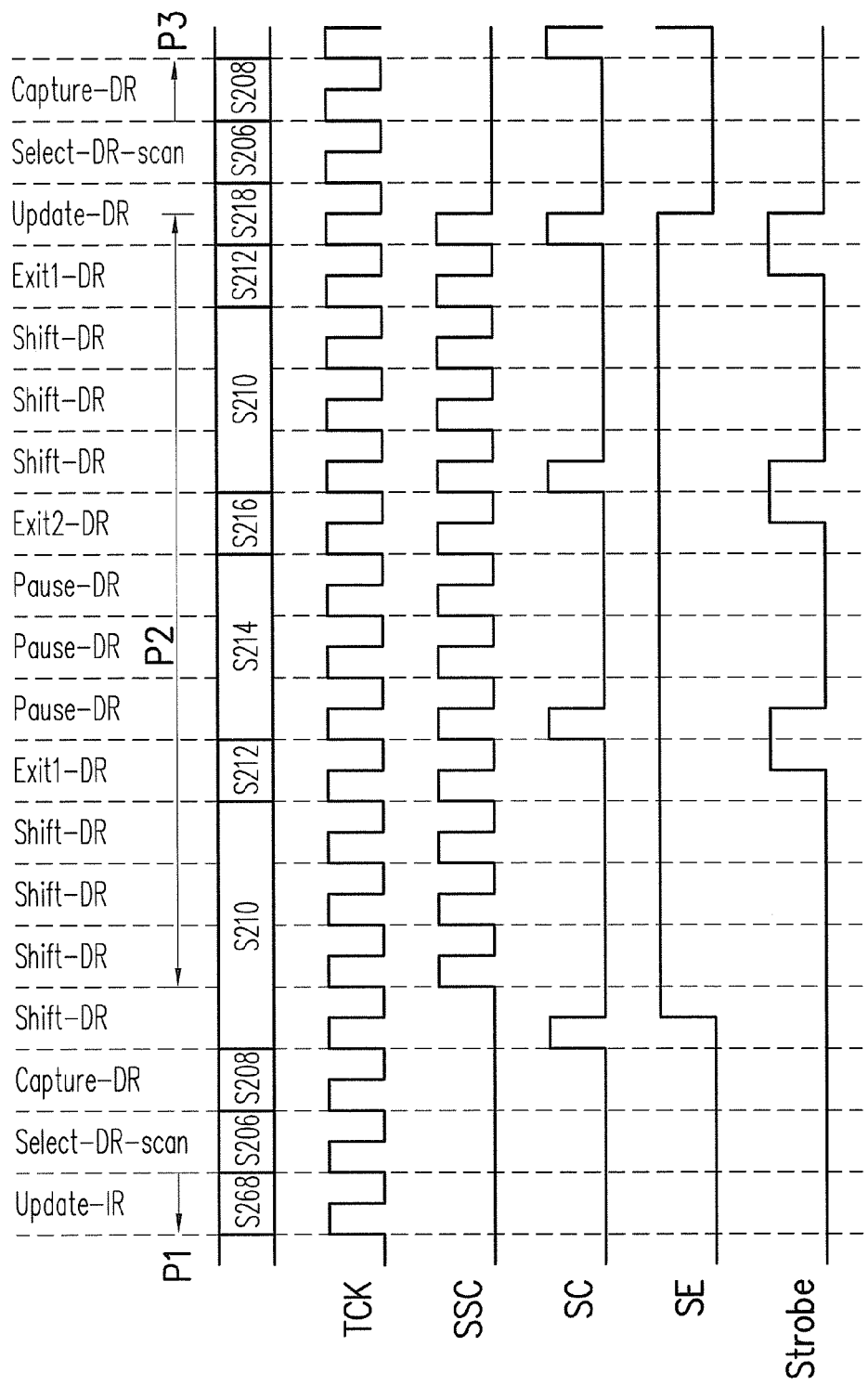
FIG. 8 is a signal waveform diagram of executing a scan chain test on the serialized compressed scan circuit of FIG. 1 according to an embodiment of the disclosure.

FIG. 8 is a signal waveform diagram of executing a scan chain test on the serialized compressed scan circuit 110 of FIG. 1 according to an embodiment of the disclosure. In FIG. 8, state transition of the integrated circuit device 190 compliant to the IEEE 1149.1 test standard (for example, the TAP state transitions as FIG. 2). Referring to FIG. 2, FIG. 3, FIG. 4, FIG. 5, FIG. 6 and FIG. 8, in the present embodiment, the state of the integrated circuit device 190 is sequentially transited from the test-logic-reset state S202, the run-test/idle state S204, and the select-DR-scan state S206 into the select-IR-scan state S256. After the instruction is loaded into the instruction register of the integrated circuit device 190, the state of the integrated circuit device 190 is returned to the select-DR-scan state S206 and then transited into the capture-DR state S208.

When the state of the integrated circuit device 190 is the capture-DR state S208, the TAP state machine of the integrated circuit device 190 enables the capture-DR state enable signal Capture-DR of the state enable bus State_Enable_Bus. The control signal generating device 310 and the clock gating device 320 generates the scan clock signal SC according to the capture-DR state enable signal Capture-DR and the test clock signal TCK. Then, the state of the integrated circuit device 190 enters the shift-DR state S210 from the capture-DR state S208. When the state of the integrated circuit device 190 is the shift-DR state S210, the TAP state machine of the integrated circuit device 190 enables the shift-DR state enable signal Shift-DR of the state enable bus State_Enable_Bus, such that the shift enable signal SE is transited from low to high. Moreover, the decompressor 114 outputs the test data D2 to the PSC circuits 117, where the compressed test data (SSI) is serially input to the deserializer 112, and the serializer 113 serially outputs the compressed test result (SSO). Then, the TAP state machine of the integrated circuit device 190 remains in the shift-DR state S210 until TMS transits to high, and then the TAP state machine of the integrated circuit device 190 transits to the exit1-DR state S212.

When the state of the integrated circuit device 190 is the exit1-DR state S212, the TAP state machine of the integrated circuit device 190 enables the exit1-DR state enable signal Exit1-DR of the state enable bus State_Enable_Bus, such that the OR gate 520 output high. The second negative edge-triggered register 414 transits the signal Strobe to high according to output of the OR gate 520 and the test clock signal TCK. Therefore, the decompressor 114 outputs the test data D2 to the PSC circuits 117, and the next compressed test data (SSI) is serially input to the deserializer 112, where the serializer 113 serially outputs the compressed test result (SSO). Then, the state of the integrated circuit device 190 transits to the pause-DR state S214 or the update-DR state S218 from the exit1-DR state S212. When the state of the integrated circuit device 190 is the pause-DR state S214, the TAP state machine of the integrated circuit device 190 enables the pause-DR state enable signal Pause-DR of the state enable bus State_Enable_Bus, such that the shift enable signal SE remains in the high logic level. Then, the state of the integrated circuit device 190 remains in the pause-DR state S214 until TMS transits to high, and then the state of the integrated circuit device 190 enters the exit2-DR state S216.

When the state of the integrated circuit device 190 is the exit2-DR state S216, the TAP state machine of the integrated circuit device 190 enables the exit2-DR state enable signal Exit2-DR of the state enable bus State_Enable_Bus, such that the OR gate 520 output high. The second negative edge-triggered register 414 transits the signal Strobe from low to high according to output of the OR gate 520 and the test clock signal TCK. the AND gate 422 controls the test clock signal TCK as the scan clock signal SC to the PSC circuits 117 of FIG. 1 when the signal Strobe is enabled. Therefore, the decompressor 114 outputs the test data D2 to the PSC circuits 117, and the next compressed test data (SSI) is serially input to the deserializer 112, where the serializer 113 serially outputs the compressed test result (SSO). Then, the state value TSM is transited to the shift-DR state S210 or the update-DR state S218 from the exit2-DR state S216.

When the state of the integrated circuit device 190 is the shift-DR state S210, the TAP state machine of the integrated circuit device 190 enables the shift-DR state enable signal Shift-DR of the state enable bus State_Enable_Bus, such that the shift enable signal SE remains high. Then, the integrated circuit device 190 remains in the shift-DR state S210 until the integrated circuit device 190 enters the exit1-DR state S212. When the state of the integrated circuit device 190 is the exit1-DR state S212, the TAP state machine of the integrated circuit device 190 enables the exit1-DR state enable signal Exit1-DR coupled to the OR gate 520 for enabling the scan clock signal SC and the strobe signal Strobe. Then, the state of the integrated circuit device 190 is transited from the exit1-DR state S212 or the exit2-DR state S216 to the update-DR state S218. Then, the state of the integrated circuit device 190 is transited from the update-DR state S218 to the select-DR-scan state S206. Finally, the state of the integrated circuit device 190 is transited from the select-DR-scan state S206 to the capture-DR state S208, such that the test result is captured to the PSC circuits 117 of the serialized compressed scan circuit 110 of FIG. 1.

Similarly, when the state of the integrated circuit device 190 is transited from the exit1-DR state S212 (or the exit2-DR state S216) to the update-DR state S218, the TAP state machine of the integrated circuit device 190 does not enable any one of the shift-DR state enable signal Shift-DR, the pause-DR state enable signal Pause-DR, the exit1-DR state enable signal Exit1-DR and the exit2-DR state enable signal Exit2-DR. Therefore, the shift enable signal SE is transited from high to low. In detail, the test equipment (not shown) could transmit an instruction during a time period P1 through the TAP (for example, the TAP 150 of FIG. 1) of the integrated circuit. Then, the integrated circuit device 190 performs a scan shift operation during a time period P2 to transmit the test data to the PSC circuits 117 of the serialized compressed scan circuit 110 of FIG. 1, and meanwhile outputs the test result data stored in the serialized compressed scan circuit 110 of FIG. 1. Then, during a time period P3, the test result of the circuit under test is captured and stored in the PSC circuits 117 of the serialized compressed scan circuit 110 of FIG. 1. Moreover, during the time period P2, the state of the integrated circuit device 190 could be returned to the shift-DR state S210 from the exit2-DR state S216 to continue the scan shift operation until transmission of the test data to the PSC circuits 117 of the serialized compressed scan circuit 110 of FIG. 1 is completed. Now, the state of the integrated circuit device 190 is transited from the exit1-DR state S212 (or the exit2-DR state S216) to the update-DR state S218, and is returned to the capture-DR state S208 from the select-DR-scan state S206, so as to output the test result during a time period P3.

Figure 9:
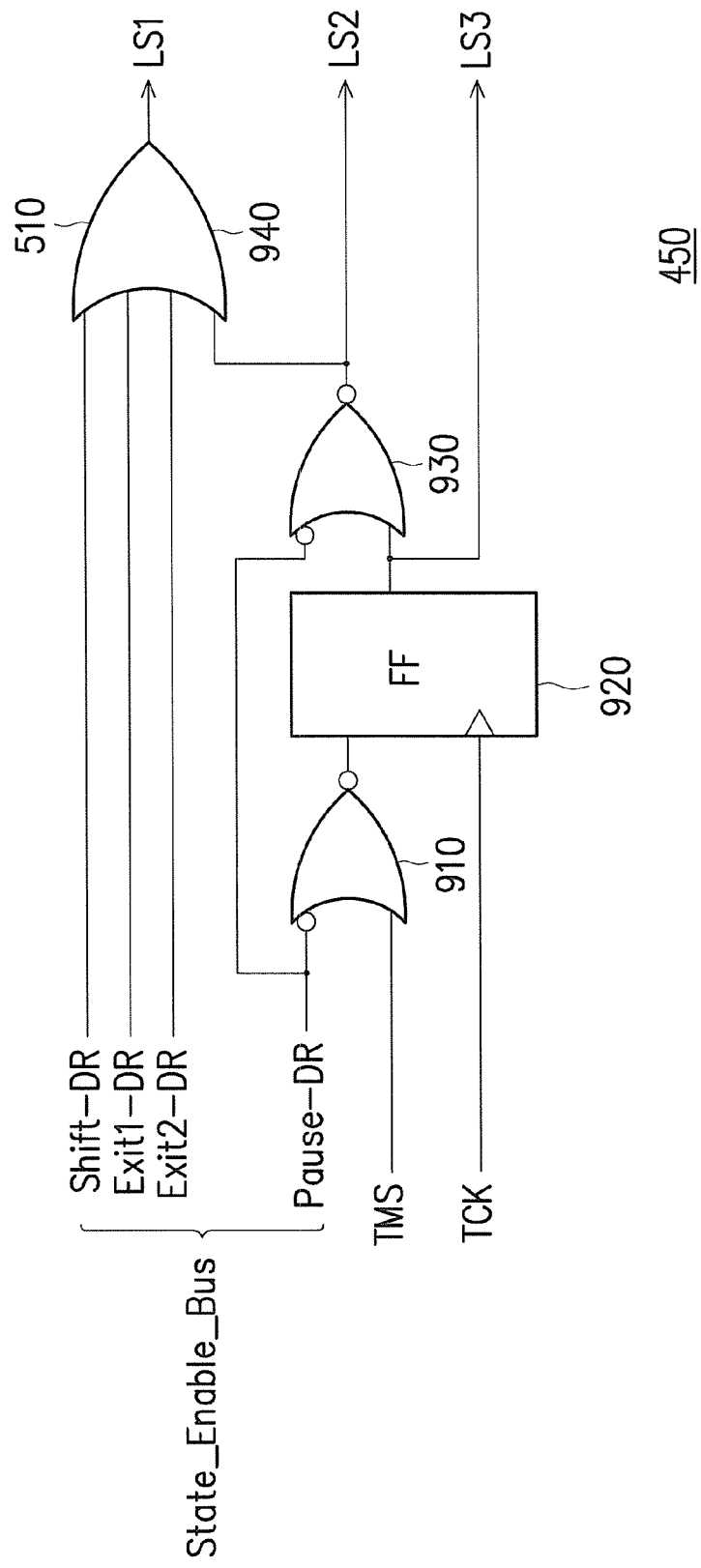
FIG. 9 illustrates the logic operation circuit of FIG. 4 according to another embodiment of the disclosure.

FIG. 9 illustrates the logic operation circuit 450 of FIG. 4 according to another embodiment of the disclosure. The logic operation circuit 450 of FIG. 9 includes a NOR gate 910, a flip-flop (FF) 920, an NOR gate 930 and an OR gate 940. The inverting input terminal of the NOR gate 910 is coupled to the state enable bus State_Enable_Bus for receiving the pause-DR state enable signal Pause-DR. The non-inverting input terminal of the NOR gate 910 is configured to receive the test mode selection signal TMS from the TAP 150. The input terminal of the flip-flop 920 is coupled to the output terminal of the NOR gate 910. The positive edge-triggered terminal of the flip-flop 920 is coupled to the test clock signal TCK. The output terminal of the flip-flop 920 provides the third logic signal LS3 to the third negative edge-triggered register 415. The inverting input terminal of the NOR gate 930 is coupled to the state enable bus State_Enable_Bus for receiving the pause-DR state enable signal Pause-DR. The non-inverting input terminal of the NOR gate 930 is coupled to the output terminal of the flip-flop 920. The output terminal of the NOR gate 930 provides the second logic signal LS2 to the second negative edge-triggered register 414. The first input terminal of the OR gate 940 is coupled to the output terminal of the NOR gate 930. The second input terminal of the OR gate 940 is coupled to the state enable bus State_Enable_Bus for receiving the shift-DR state enable signal Shift-DR. The third input terminal of the OR gate 940 is coupled to the state enable bus State_Enable_Bus for receiving the exit1-DR state enable signal Exit1-DR. The fourth input terminal of the OR gate 940 is coupled to the state enable bus State_Enable_Bus for receiving the exit2-DR state enable signal Exit2-DR. The output terminal of the OR gate 940 provides the first logic signal LS1 to the first negative edge-triggered register 413.

Figure 10:
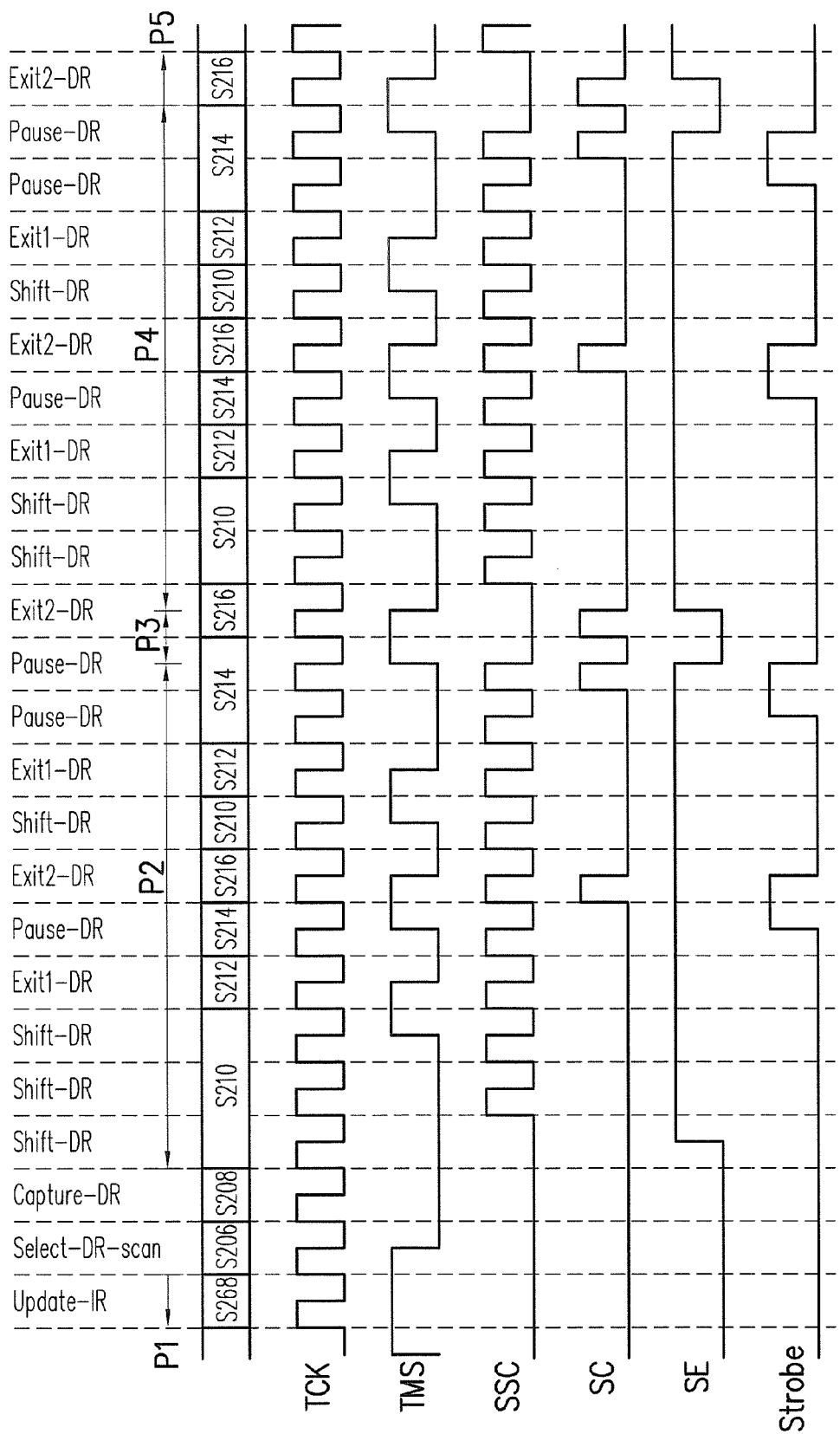
FIG. 10 is a signal waveform diagram of executing a scan chain test on the serialized compressed scan circuit of FIG. 1 according to an embodiment of the disclosure.

FIG. 10 is a signal waveform diagram of executing a scan chain test on the serialized compressed scan circuit 110 of FIG. 1 according to an embodiment of the disclosure. In FIG. 10, state transition of the integrated circuit device 190 compliant to the IEEE 1149.1 test standard (for example, the TAP state transitions as FIG. 2). Referring to FIG. 2, FIG. 3, FIG. 4, FIG. 6, FIG. 9 and FIG. 10, in the present embodiment, the state of the integrated circuit device 190 is sequentially transited from the test-logic-reset state S202, the run-test/idle state S204, and the select-DR-scan state S206 to the select-IR-scan state S256. After the instruction is loaded to the instruction register of the integrated circuit device 190, the state of integrated circuit device 190 returns to the select-DR-scan state S206 and then transits to the shift-DR state S210 through the capture-DR state S208. When the state of the integrated circuit device 190 is the shift-DR state S210, the TAP state machine of the integrated circuit device 190 enables the shift-DR state enable signal Shift-DR on the state enable bus State_Enable_Bus, and the shift enable signal SE is transited from low to high. Then, the integrated circuit device 190 remains in the shift-DR state S210 until the test mode select signal TMS is high and then enters the exit1-DR state S212. When the state of the integrated circuit device 190 is the exit1-DR state S212, the TAP state machine of the integrated circuit device 190 enables the exit1-DR state enable signal Exit1-DR on the state enable bus State_Enable_Bus, such that the shift enable signal SE remains in high. Then, the state of the integrated circuit device 190 is transited from the exit1-DR state S212 to the pause-DR state S214.

When the state of the integrated circuit device 190 is the pause-DR state S214, the TAP state machine of the integrated circuit device 190 enables the pause-DR state enable signal Pause-DR on the state enable bus State_Enable_Bus and the strobe signal Strobe, while the shift enable signal SE remains in high. Then, when the test mode selection signal TMS is high, and the TAP state machine is transited from the pause-DR state S214 to the exit2-DR state S216, the TAP state machine enables the exit2-DR state enable signal Exit2-DR on the state enable bus State_Enable_Bus, while the shift enable signal SE remains in high. Then, the state of the integrated circuit device 190 is returned to the shift-DR state S210 from the exit2-DR state S216. Then, when the TAP state machine of the integrated circuit device 190 is sequentially transited from the shift-DR state S210, the exit1-DR state S212 to the pause-DR state S214, and the test mode selection signal TMS is low, the integrated circuit device 190 remains in the pause-DR state S214, and the shift enable signal SE is transited from high to low. Therefore, the test result from a test pattern has been captured. Then, when the test mode selection signal TMS is high, and the TAP state machine of the integrated circuit device 190 is transited from the pause-DR state S214 to the exit2-DR state S216, the TAP state machine enables the exit2-DR state enable signal Exit2-DR on the state enable bus State_Enable_Bus, such that the shift enable signal SE is transited to high, so as to perform the scan shift operation on the other test pattern.

In detail, by coupling to the TAP (for example, the TAP 150 of FIG. 1) of the integrated circuit, the test equipment could transmit the instruction during the time period P1 in FIG. 10. Then, the integrated circuit device 190 performs the scan shift operation during the time period P2 in FIG. 10. Then, during the time period P3 in FIG. 10, the test result of the circuit under test is captured and stored in the PSC circuits 117 of the serialized compressed scan circuit 110 of FIG. 1. Then, the integrated circuit device 190 performs the scan shift operation on the second test pattern during the time period P4 in FIG. 10. Then, during the time period P5 in FIG. 10, the test result of the circuit under test is captured and stored in the PSC circuits 117 of the serialized compressed scan circuit 110 of FIG. 1.

Figure 11:
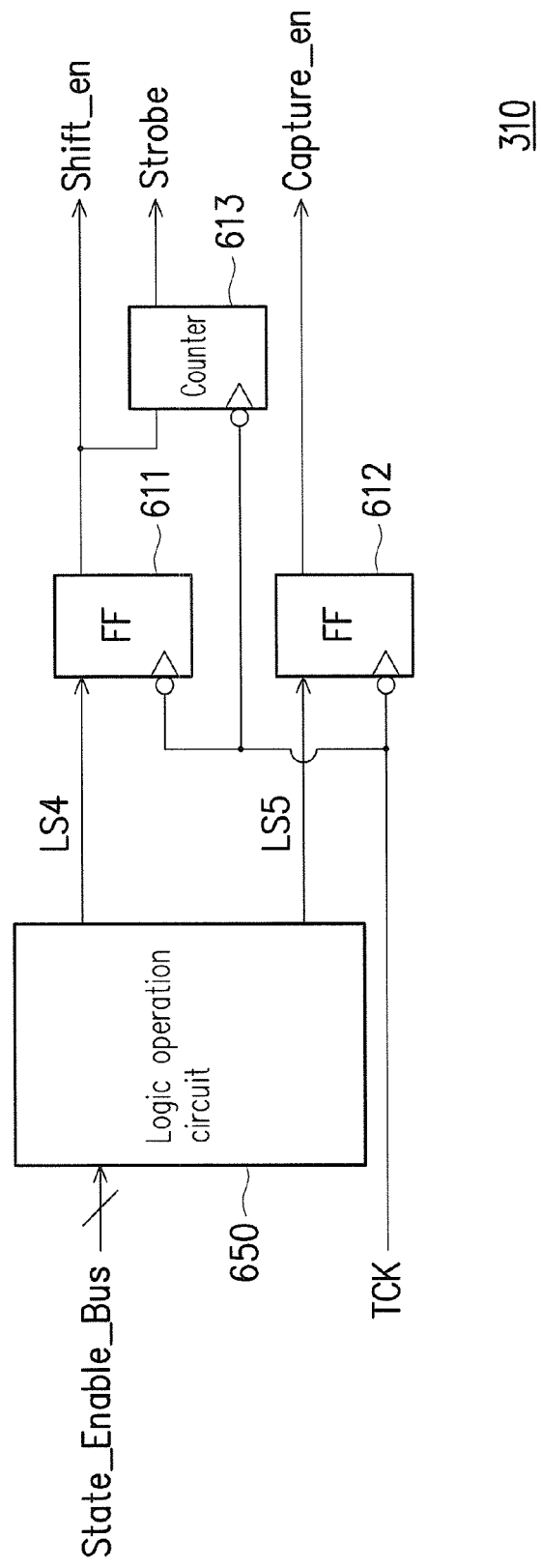
FIG. 11 illustrates the control signal generating device of FIG. 3 according to another embodiment of the disclosure.

FIG. 11 illustrates the control signal generating device 310 of FIG. 3 according to another embodiment of the disclosure. The control signal generating device 310 includes a logic operation circuit 650, a first negative edge-triggered register 611, a second negative edge-triggered register 612 and a negative edge-triggered counter 613. The logic operation circuit 650 is coupled to the state enable bus State_Enable_Bus for receiving the at least one state enable signal, and correspondingly generates a first logic signal LS4 and a second logic signal LS5. For example, the logic operation circuit 650 may receive an exit1-data-register (exit1-DR) state enable signal Exit1-DR, an exit2-data-register (exit2-DR) state enable signal Exit2-DR, a shift-data-register (shift-DR) state enable signal Shift-DR, a pause-data-register (pause-DR) state enable signal Pause-DR and/or a capture-data-register (capture-DR) state enable signal Capture-DR from the state enable bus State_Enable_Bus.

In the present embodiment of FIG. 11, the registers 611 and 612 may be flip-flops (FFs). The input terminal of the first negative edge-triggered register 611 is coupled to the logic operation circuit 650 for receiving the first logic signal LS4. The negative edge-triggered terminal of the first negative edge-triggered register 611 is coupled to the test clock signal TCK. The output terminal of the first negative edge-triggered register 611 is coupled to the clock gating device 320 for providing the shift enable signal Shift_en. The input terminal of the second negative edge-triggered register 612 is coupled to the logic operation circuit 650 for receiving the second logic signal LS5. The negative edge-triggered terminal of the second negative edge-triggered register 612 is coupled to the test clock signal TCK. The output terminal of the second negative edge-triggered register 612 is coupled to the clock gating device 320 for providing the capture enable signal Capture_en. The input terminal of the negative edge-triggered counter 613 is coupled to the output terminal of the first negative edge-triggered register 611 for receiving the shift enable signal Shift_en. The negative edge-triggered terminal of the negative edge-triggered counter 613 is coupled to the test clock signal TCK. The output terminal of the negative edge-triggered counter 613 is coupled to the clock gating device 320 for providing the strobe signal Strobe. Wherein, cyclic counting of the negative edge-triggered counter 613 from a first value to a second value is activated when the shift enable signal Shift_en is enabled and the test clock signal TCK is at negative edge. In some embodiments, a difference between the second value and the first value may be a serializer bit length (e.g. bit length of the serializer 113 of FIG. 1) minus one or a deserializer bit length (e.g. bit length of the deserializer 112 of FIG. 1) minus one.

Figure 12:
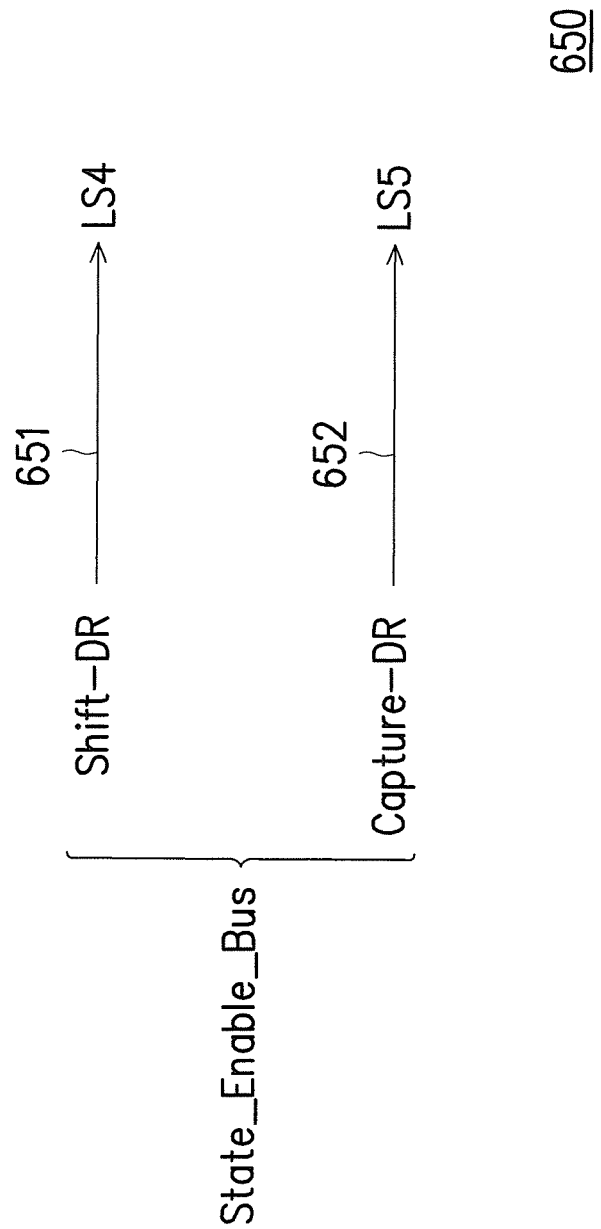
FIG. 12 illustrates the logic operation circuit of FIG. 11 according to an embodiment of the disclosure.

FIG. 12 illustrates the logic operation circuit 650 of FIG. 11 according to an embodiment of the disclosure. The logic operation circuit 650 includes a first wire 651 and a second wire 652. The first terminal of the first wire 651 is coupled to the state enable bus State_Enable_Bus for receiving the shift-DR state enable signal Shift-DR. The second terminal of the first wire 651 output the shift-DR state enable signal Shift-DR to serve as the first logic signal LS4. The first terminal of the second wire 652 is coupled to the state enable bus State_Enable_Bus for receiving the capture-DR state enable signal Capture-DR. The second terminal of the second wire 652 output the capture-DR state enable signal Capture-DR to serve as the second logic signal LS5.

Figure 13:
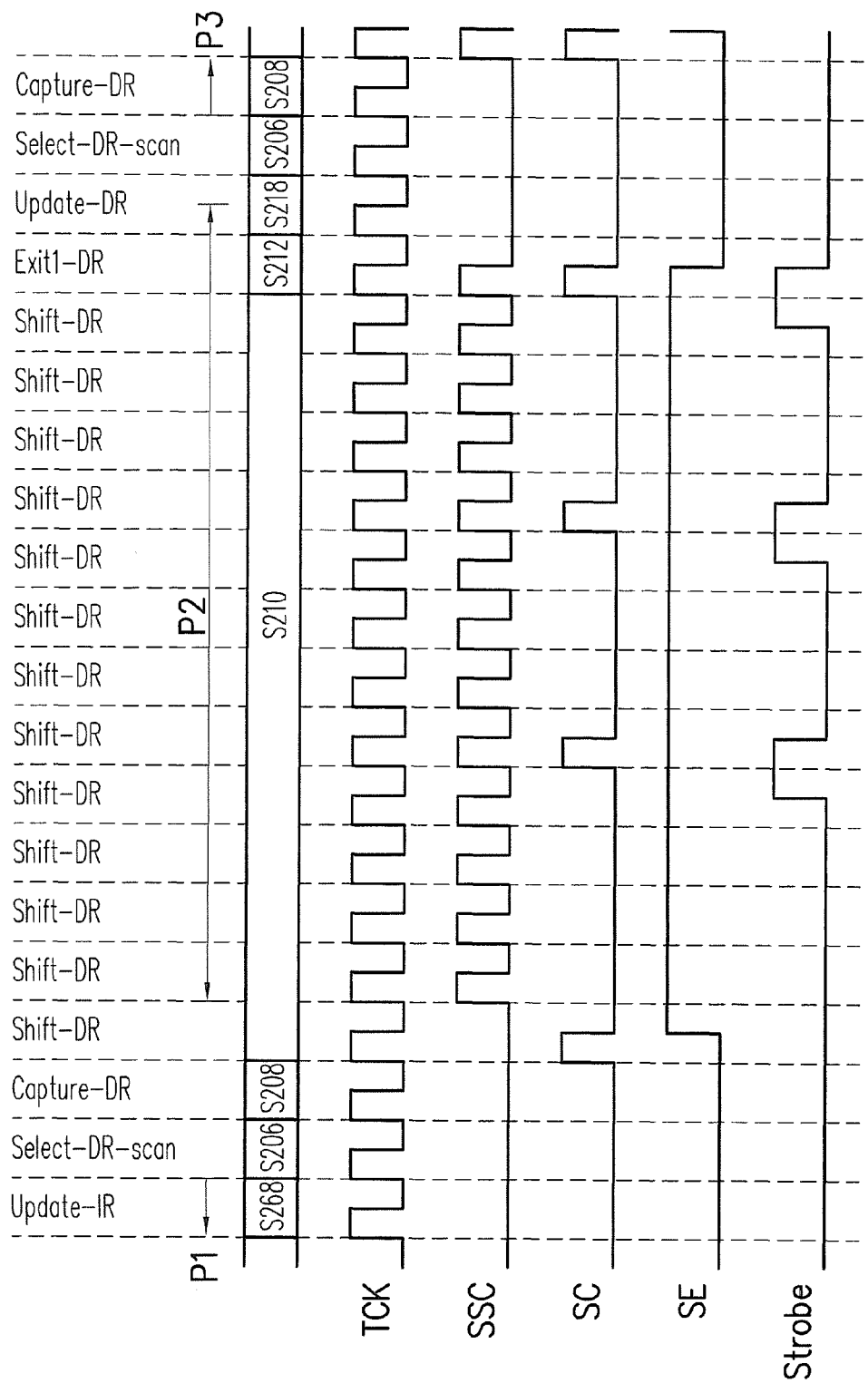
FIG. 13 is a signal waveform diagram of executing a scan chain test on the serialized compressed scan circuit of FIG. 1 according to an embodiment of the disclosure.

FIG. 13 is a signal waveform diagram of executing a scan chain test on the serialized compressed scan circuit 110 of FIG. 1 according to an embodiment of the disclosure. In FIG. 13, state transition of the integrated circuit device 190 compliant to the IEEE 1149.1 test standard (for example, the TAP state transitions as FIG. 2). Referring to FIG. 2, FIG. 3, FIG. 6, FIG. 11, FIG. 12 and FIG. 13, in the present embodiment, the state of the integrated circuit device 190 sequentially transits from the test-logic-reset state S202, the run-test/idle state S204, and the select-DR-scan state S206 to enter the select-IR-scan state S256, and after the instruction is loaded to the instruction register of the integrated circuit device 190, the state of the integrated circuit device 190 is returned to the select-DR-scan state S206 and then entered the capture-DR state S208. When the state of the integrated circuit device 190 is the capture-DR state S208, the TAP state machine of the integrated circuit device 190 enables the capture-DR state enable signal Capture-DR coupled to the second negative edge-triggered register 612 through the state enable bus State_Enable_Bus for enabling the scan clock signal SC. Then, the state of the integrated circuit device 190 transits to the shift-DR state S210 from the capture-DR state S208.

When the state of the integrated circuit device 190 is the shift-DR state S210, the TAP state machine of the integrated circuit device 190 enables the shift-DR state enable signal Shift-DR on the state enable bus State_Enable_Bus, such that the shift enable signal SE is transited from low to high. Moreover, the decompressor 114 outputs the test data D2 to the PSC circuits 117, where the compressed test data (SSI) is serially input to the deserializer 112, and the serializer 113 serially outputs the compressed test result (SSO) while the shift enable signal SE is enabled. When the enable signal Shift_en is high, the counter 613 counts the number of the negative edges (falling edges) of the test clock signal TCK that the integrated circuit device 190 remains in the shift-DR state S210. Then, when the counting result of the counter 613 reaches a specific value, the counter 613 enables the strobe signal Strobe, where the specific value is determined by a conversion bit length of the deserializer 112 or the serializer 113 of FIG. 1. Then, the clock gating device 320 generates the scan clock signal SC in response to the strobe signal Strobe. According to the aforementioned descriptions, after processing of a test pattern receiving from the test equipment is completed, the state of the integrated circuit device 190 is sequentially transited from the shift-DR state S210, the exit1-DR state S212, the update-DR state S218, the select-DR-scan state S206 to the capture-DR state S208. Moreover, when the state of the integrated circuit device 190 is transited from the shift-DR state S210 to the exit1-DR state S212, the TAP state machine of the integrated circuit device 190 disables the shift-DR state enable signal Shift-DR, and the shift enable signal SE is transited from high to low.

In detail, the test equipment could transmit an instruction during the time period P1 in FIG. 13 through the TAP (for example, the TAP 150 of FIG. 1) of the integrated circuit. Then, the integrated circuit device 190 performs a scan shift operation during the time period P2 in FIG. 13 to transmit the test data to the PSC circuits 117 of the serialized compressed scan circuit 110 of FIG. 1, and meanwhile outputs the test result data stored in the serialized compressed scan circuit 110 of FIG. 1. Then, during the time period P3 in FIG. 13, the test result of the circuit under test is captured and stored in the PSC circuits 117 of the serialized compressed scan circuit 110 of FIG. 1. Moreover, during the time period P2 in FIG. 13, the state of the integrated circuit device 190 is remained in the shift-DR state S210 to continue the scan shift operation until transmission of the test data to the PSC circuits 117 of the serialized compressed scan circuit 110 of FIG. 1 is completed. Now, the state of the integrated circuit device 190 is transited from the shift-DR state S210 to the exit1-DR state S212. Then, the state of the integrated circuit device 190 is transited from the exit1-DR state S212 to the update-DR state S218, and returns to the capture-DR state S208 from the select-DR-scan state S206, so as to output the test result, where the test result is captured to the PSC circuits 117.

Figure 14:
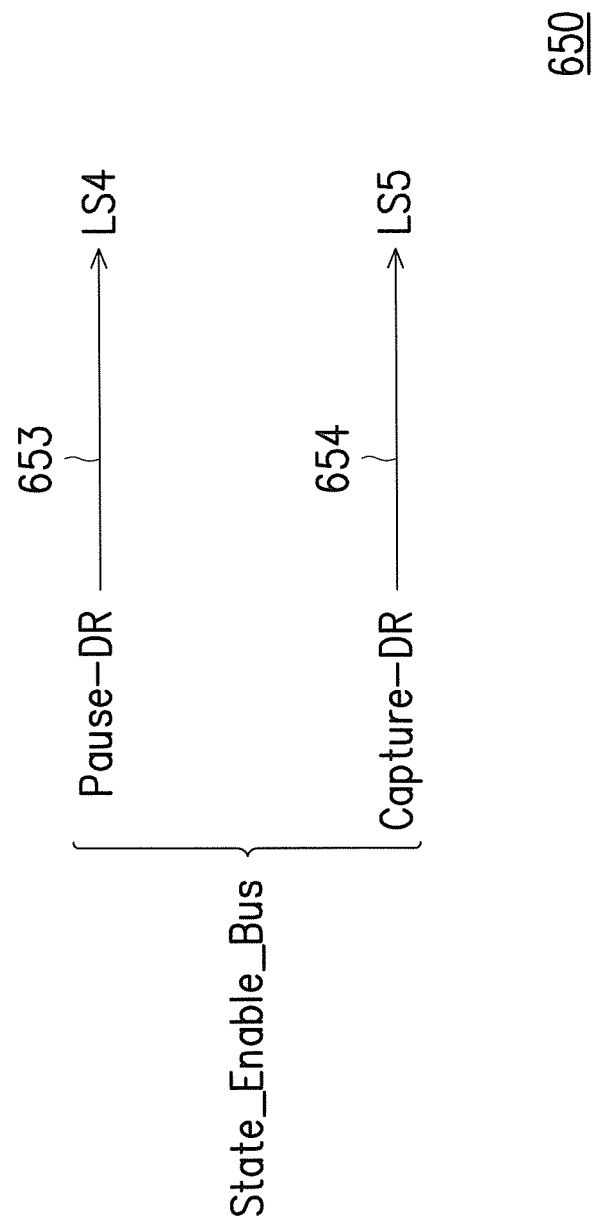
FIG. 14 illustrates the logic operation circuit of FIG. 11 according to an embodiment of the disclosure.

FIG. 14 illustrates the logic operation circuit 650 of FIG. 11 according to another embodiment of the disclosure. The logic operation circuit 650 includes a first wire 653 and a second wire 654. The first terminal of the first wire 653 is coupled to the state enable bus State_Enable_Bus for receiving a pause-DR state enable signal Pause-DR. The second terminal of the first wire 653 output the pause-DR state enable signal Pause-DR to serve as the first logic signal LS4. The first terminal of the second wire 654 is coupled to the state enable bus State_Enable_Bus for receiving a capture-DR state enable signal Capture-DR. The second terminal of the second wire 654 output the capture-DR state enable signal Capture-DR to serve as the second logic signal LS5.

Figure 15:
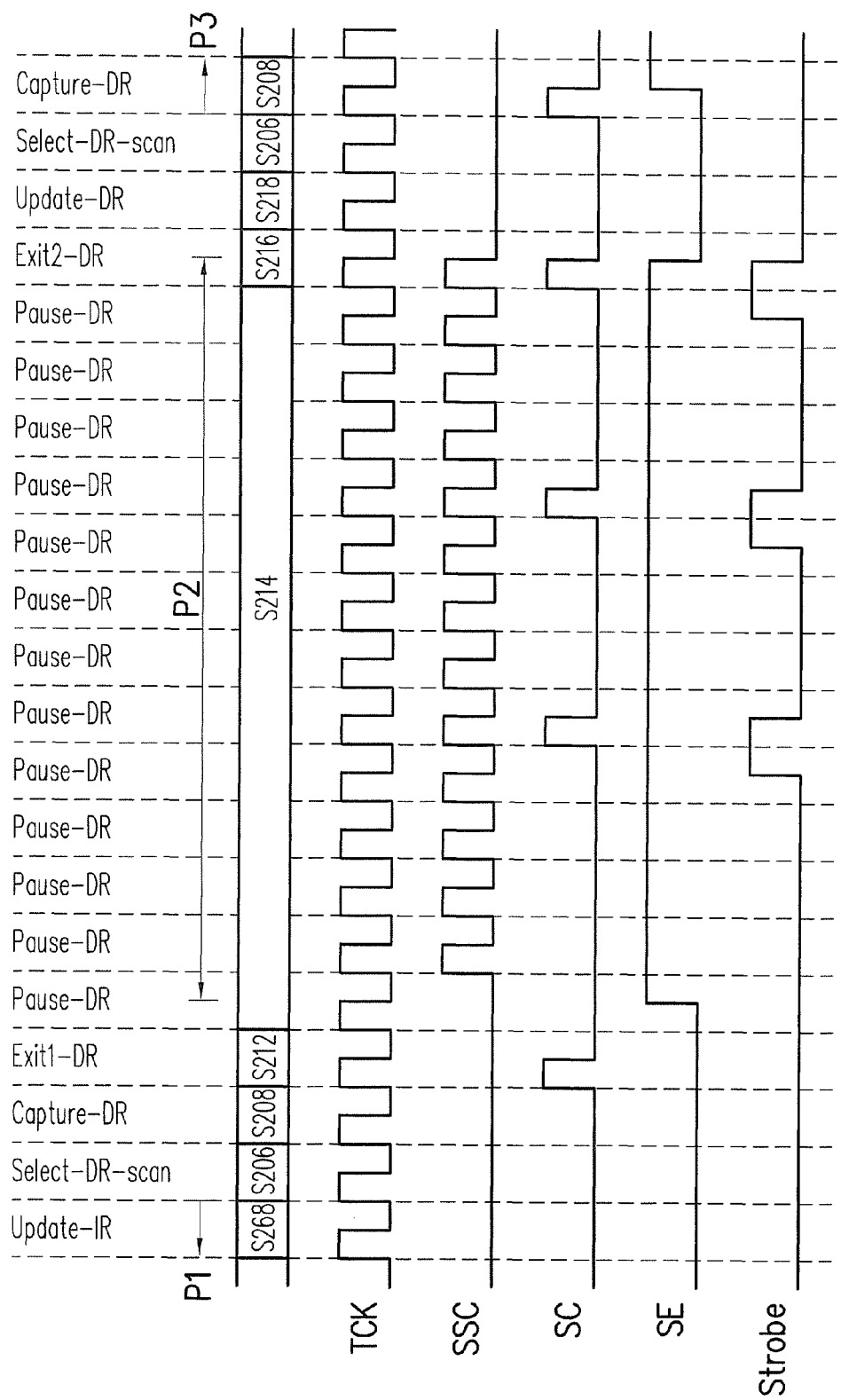
FIG. 15 is a signal waveform diagram of executing a scan chain test on the serialized compressed scan circuit of FIG. 1 according to another embodiment of the disclosure.

FIG. 15 is a signal waveform diagram of executing a scan chain test on the serialized compressed scan circuit 110 of FIG. 1 according to another embodiment of the disclosure. In FIG. 15, state transition of the integrated circuit device 190 compliant to the IEEE 1149.1 test standard (for example, the TAP state transitions as FIG. 2). Referring to FIG. 2, FIG. 3, FIG. 6, FIG. 11, FIG. 14 and FIG. 15, in the present embodiment, the state of the integrated circuit device 190 sequentially transits from the test-logic-reset state S202, the run-test/idle state S204, and the select-DR-scan state S206 to enter the select-IR-scan state S256, and after the instruction is loaded to the instruction register of the integrated circuit device 190, the state of the integrated circuit device 190 is returned to the select-DR-scan state S206 and then entered the capture-DR state S208. When the state of the integrated circuit device 190 is the capture-DR state S208, the TAP state machine of the integrated circuit device 190 enables the capture-DR state enable signal Capture-DR coupled to the second negative edge-triggered register 612 through the state enable bus State_Enable_Bus for enabling the scan clock signal SC. Then, the state of the integrated circuit device 190 transits from the capture-DR state S208 to the exit1-DR state S212 and then to the pause-DR state S214.

When the state of the integrated circuit device 190 is the pause-DR state S214, the TAP state machine of the integrated circuit device 190 enables the pause-DR state enable signal Pause-DR on the state enable bus State_Enable_Bus for transiting the shift enable signal SE from low to high. Therefore, the decompressor 114 outputs the test data D2 to the PSC circuits 117, where the compressed test data SSI is serially input to the deserializer 112, and the serializer 113 serially outputs the compressed test result (SSO). When the enable signal Shift_en is high, the counter 613 counts the number of negative edges of the test clock signal TCK that the integrated circuit device 190 remains in the pause-DR state S214. Then, when the counting result of the counter 613 reaches a specific value, the counter 613 enables the strobe signal Strobe, where the specific value is determined by a conversion bit length of the deserializer 112 or the serializer 113 of FIG. 1. Then, the clock gating device 320 generates the scan clock signal SC in response to the strobe signal Strobe. According to the aforementioned descriptions, after processing of a test pattern is completed, the state of the integrated circuit device 190 sequentially transits from the pause-DR state S214, the exit2-DR state S216, the update-DR state S218, the select-DR-scan state S206 to the capture-DR state S208. Therefore, the test result is captured to the PSC circuits 117. Moreover, when the state of the integrated circuit device 190 is transited from the pause-DR state S214 to the exit2-DR state S216, the TAP state machine of the integrated circuit device 190 disables the pause-DR state enable signal Pause-DR, and the shift enable signal SE is transited from high to low.

Figure 16:
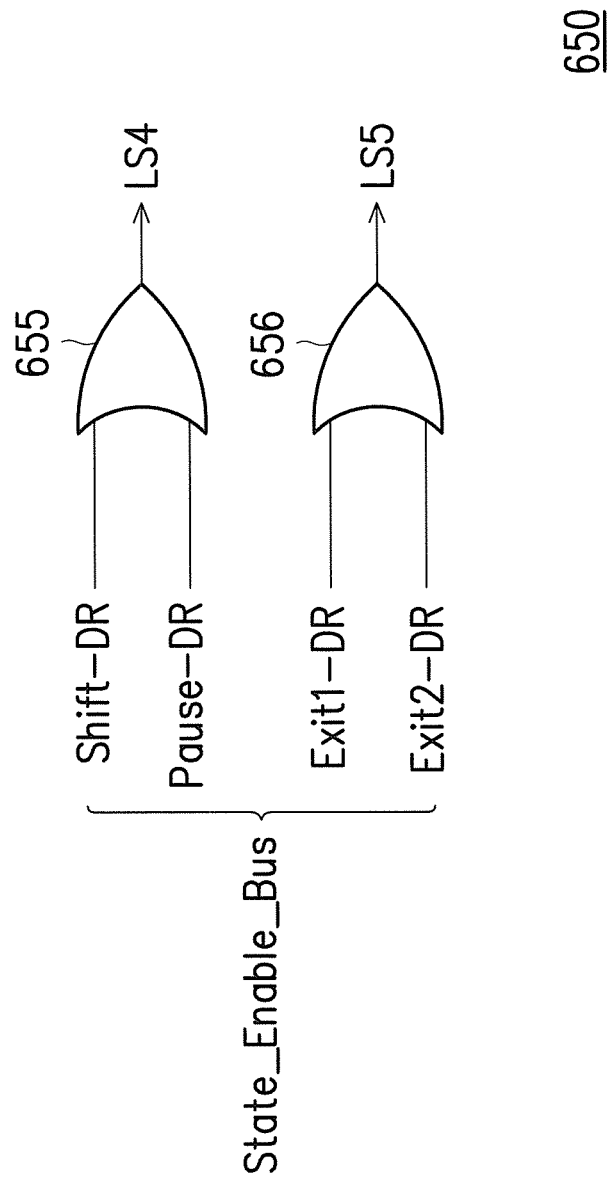
FIG. 16 illustrates the logic operation circuit of FIG. 11 according to another embodiment of the disclosure.

FIG. 16 illustrates the logic operation circuit 650 of FIG. 11 according to another embodiment of the disclosure. The logic operation circuit 650 includes a first OR gate 655 and a second OR gate 656. The first input terminal of the first OR gate 655 is coupled to the state enable bus State_Enable_Bus for receiving the shift-DR state enable signal Shift-DR. The second input terminal of the first OR gate 655 is coupled to the state enable bus State_Enable_Bus for receiving the pause-DR state enable signal Pause-DR. The output terminal of the first OR gate 655 generates the first logic signal LS4 to the input terminal of the first negative edge-triggered register 611. The first input terminal of the second OR gate 656 is coupled to the state enable bus State_Enable_Bus for receiving the exit1-DR state enable signal Exit1-DR. The second input terminal of the second OR gate 656 is coupled to the state enable bus State_Enable_Bus for receiving an exit2-DR state enable signal Exit2-DR. The output terminal of the second OR gate 656 generates the second logic signal LS5 to the input terminal of the second negative edge-triggered register 612.

Figure 17:
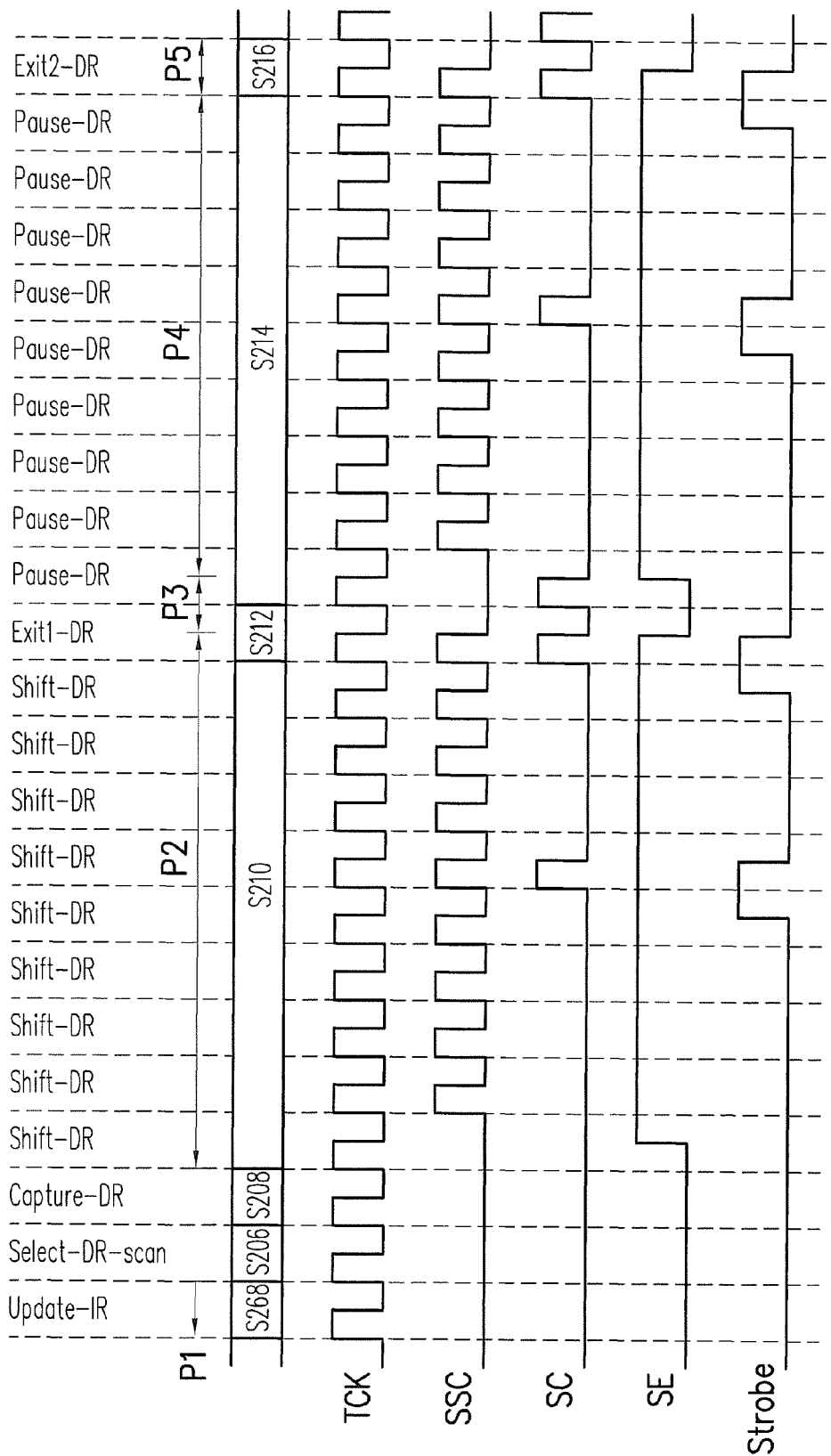
FIG. 17 is a signal waveform diagram of executing a scan chain test on the serialized compressed scan circuit of FIG. 1 according to another embodiment of the disclosure.

FIG. 17 is a signal waveform diagram of executing a scan chain test on the serialized compressed scan circuit 110 of FIG. 1 according to another embodiment of the disclosure. In FIG. 17, state transition of the integrated circuit device 190 compliant to the IEEE 1149.1 test standard (for example, the TAP state transitions as FIG. 2). Referring to FIG. 2, FIG. 3, FIG. 6, FIG. 11, FIG. 16 and FIG. 17, in the present embodiment, the state of the integrated circuit device 190 sequentially transits from the test-logic-reset state S202, the run-test/idle state S204, and the select-DR-scan state S206 to the select-IR-scan state S256, and after the instruction is loaded to the instruction register of the integrated circuit device 190, the state of the integrated circuit device

190 sequentially enters to the select-DR-scan state S206, the capture-DR state S208 and the shift-DR state S210.

When the state of the integrated circuit device 190 is the shift-DR state S210, the TAP state machine of the integrated circuit device 190 enables the shift-DR state enable signal Shift-DR on the state enable bus State_Enable_Bus, and the shift enable signal SE is transited from low to high. Moreover, the decompressor 114 outputs the test data D2 to the PSC circuits 117, where the compressed test data SS1 is serially input to the deserializer 112, and the serializer 113 serially outputs the compressed test result (SSO). When the enable signal Shift_en is high, the counter 613 counts the number of negative edges of the test clock signal TCK that the integrated circuit device 190 remains in the shift-DR state S210. Then, when the counting result of the counter 613 reaches a specific value, the counter 613 enables the strobe signal Strobe, where the specific value is determined by a conversion bit length of the deserializer 112 or the serializer 113 of FIG. 1. Then, the clock gating device 320 generates the scan clock signal SC in response to the strobe signal Strobe. After processing of a test pattern is completed, the state of the integrated circuit device 190 is sequentially transited from the shift-DR state S210 and the exit1-DR state S212 to the pause-DR state S214. Moreover, when the state of the integrated circuit device 190 is transited from the shift-DR state S210 to the exit1-DR state S212, the TAP state machine of the integrated circuit device 190 disables the shift-DR state enable signal Shift-DR, and the shift enable signal SE is transited from high to low.

In detail, the test equipment could transmit the serialized compressed scan instruction during the time period P1 in FIG. 17 through the TAP (for example, the TAP 150 of FIG. 1) of the integrated circuit. Then, the integrated circuit device 190 performs a scan shift operation during the time period P2 in FIG. 17 to transmit the test data to the PSC circuits 117 of the serialized compressed scan circuit 110 of FIG. 1, and meanwhile outputs the test result data stored in the serialized compressed scan circuit 110 of FIG. 1. Then, during the time period P3 in FIG. 17, the test result of the circuit under test is captured and stored in the PSC circuits 117 of the serialized compressed scan circuit 110 of FIG. 1. Then, the state of the integrated circuit device 190 is transited from the exit1-DR state S212 to the pause-DR state S214. When the state of the integrated circuit device 190 is the pause-DR state S214, the TAP state machine of the integrated circuit device 190 enables the pause-DR state enable signal Pause-DR on the state enable bus State_Enable_Bus, and the shift enable signal SE is transited from low to high. Therefore, the counter 613 counts the number of negative edges of the test clock signal TCK that the integrated circuit device 190 in the pause-DR state S214. Moreover, the decompressor 114 outputs the test data to the PSC circuits 117, where the compressed test data is serially input to the deserializer 112, and the serializer 113 serially outputs the compressed test result. Then, when the counting result of the counter 613 reaches a specific value, the counter 613 enables the strobe signal Strobe. Then, the clock gating device 320 generates the scan clock signal SC in response to the strobe signal Strobe. Therefore, after processing of a second test pattern is completed, the state of the integrated circuit device 190 is sequentially transited from the pause-DR state S214, the exit2-DR state S216, the update-DR state S218, the select-DR-scan state S206 to the capture-DR state S208. Moreover, when the state of the integrated circuit device 190 is transited from the pause-DR state S214 to the exit2-DR state S216, the TAP state machine of the integrated circuit device 190 disables the state indication signal pause-DR, and the shift enable signal SE is transited from high to low. In detail, the integrated circuit device 190 performs the scan shift operation on the second test pattern during a time period P4 in FIG. 17. Then, during a time period P5 in FIG. 17, the test equipment captures the test result through the TAP.

Figure 18:
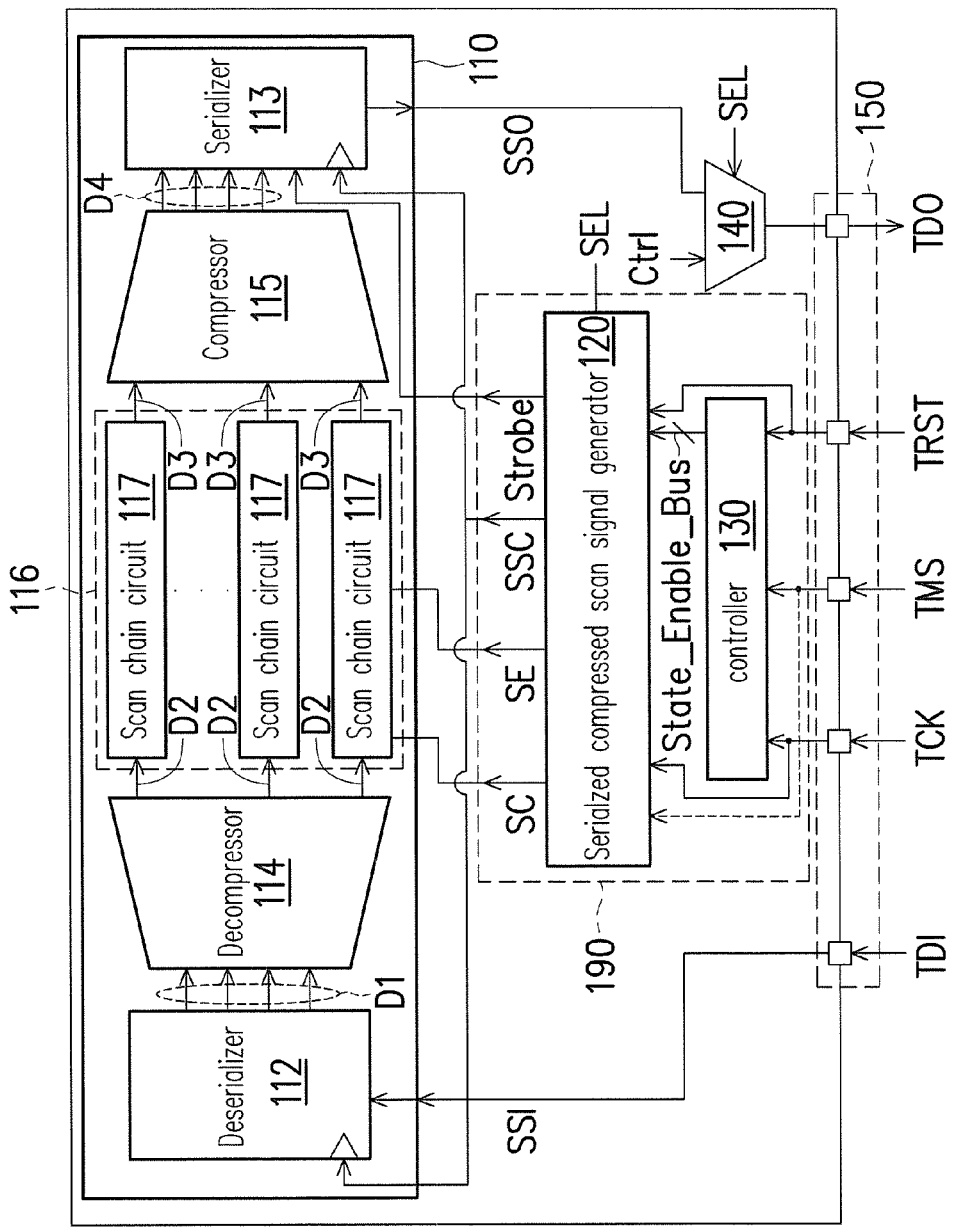
FIG. 18 illustrates an integrated circuit according to another embodiment of the disclosure.

FIG. 18 illustrates an integrated circuit 1800 according to another embodiment of the disclosure. The integrated circuit 1800 includes a serialized compressed scan circuit 110, an integrated circuit device 190, a multiplexer 140 and a test access port (TAP) 150. The integrated circuit 1800 may be coupled to a test equipment (not shown) through the TAP 150, and receives a test data input signal TDI, a test clock signal TCK, a test mode selection signal TMS and an optional test reset signal TRST from the test equipment, and provides a test result data output signal TDO to the test equipment. The integrated circuit 1800 may be implemented with reference to FIG. 1. The test data input signal TDI, a test clock signal TCK and the test mode selection signal TMS could be compliant to IEEE 1149.1 standard. The integrated circuit device 190 generates input control signals of the serialized compressed scan circuit 110. In the present embodiment, the input control signals of the serialized compressed scan circuit 110 include a shift enable signal SE, a strobe signal Strobe, a serialized scan clock signal SSC and a scan clock signal SC. Moreover, the test data input signal TDI of the TAP 150 could be coupled to the serialized compressed scan circuit 110 to serve as a serialized scan data input signal SSI, and a serialized scan data output signal SSO of the serialized compressed scan circuit 110 could be serve as the test result data output signal TDO of the TAP 150.

In the present embodiment, the integrated circuit device 190 includes a serialized compressed scan signal generator 120 and a controller 130. The serialized compressed scan signal generator 120 may be implemented with reference to FIG. 3. The controller 130 is coupled to the state enable bus State_Enable_Bus for providing the at least one state enable signal to the control signal generating device 310 of the serialized compressed scan signal generator 120. The controller 130 is coupled to the TAP 150 for receiving the test clock signal TCK, the test mode selection signal TMS and the optional test reset signal TRST from the test equipment. The controller 130 may be a test access port (TAP) controller with a TAP state machine, and the at least one state enable signal on the state enable bus State_Enable_Bus is (are) generated by the TAP state machine of the controller 130 which compliant to IEEE 1149.1 standard. The TAP state machine of the controller 130 may be a finite state machine (FSM) or other state control circuit.

The state transition of the TAP state machine of the controller 130 may be implemented with reference to FIG. 2 and FIG. 7. For example, the TAP state machine of the controller 130 could be the FSM having 16 state values which is compliant to IEEE 1149.1 standard, where a state value stored in a state register represents a state of the FSM. An instruction come from the test equipment (not shown) is loaded to an instruction register of the controller 130. The controller 130 could transit its current state to another one or remain in the same state according to its current state, the test clock signal TCK, the test mode selection signal TMS and the optional test reset signal TRST. The controller 130 generates corresponding state enable signals to indicate the states of the integrated circuit device 190, where the state enable signals generated by the controller 130 construct a state enable bus State_Enable_Bus and are coupled to the serialized compressed scan signal generator 120. The serialized compressed scan signal generator 120 generates a scan clock signal SC, a shift enable signal SE, a strobe signal Strobe and a serialized scan clock signal SSC to the serialized compressed scan circuit 110 according to the test clock signal TCK, the optional test reset signal TRST and the test mode selection signal TMS received from the TAP 150 and the state enable signals of the state enable bus State_Enable_Bus received from the controller 130. Moreover, the test data input signal TDI of the TAP 150 could be coupled to the serialized compressed scan circuit 110 to serve as a serialized scan data input signal SSI, and a serialized scan data output signal SSO of the serialized compressed scan circuit 110 could be coupled to the multiplexer 140. Whether the test result data output signal TDO is couple to the serialized scan data output signal SSO or to other test result data to the TAP 150 is determined by the multiplexer 140.

Figure 19:
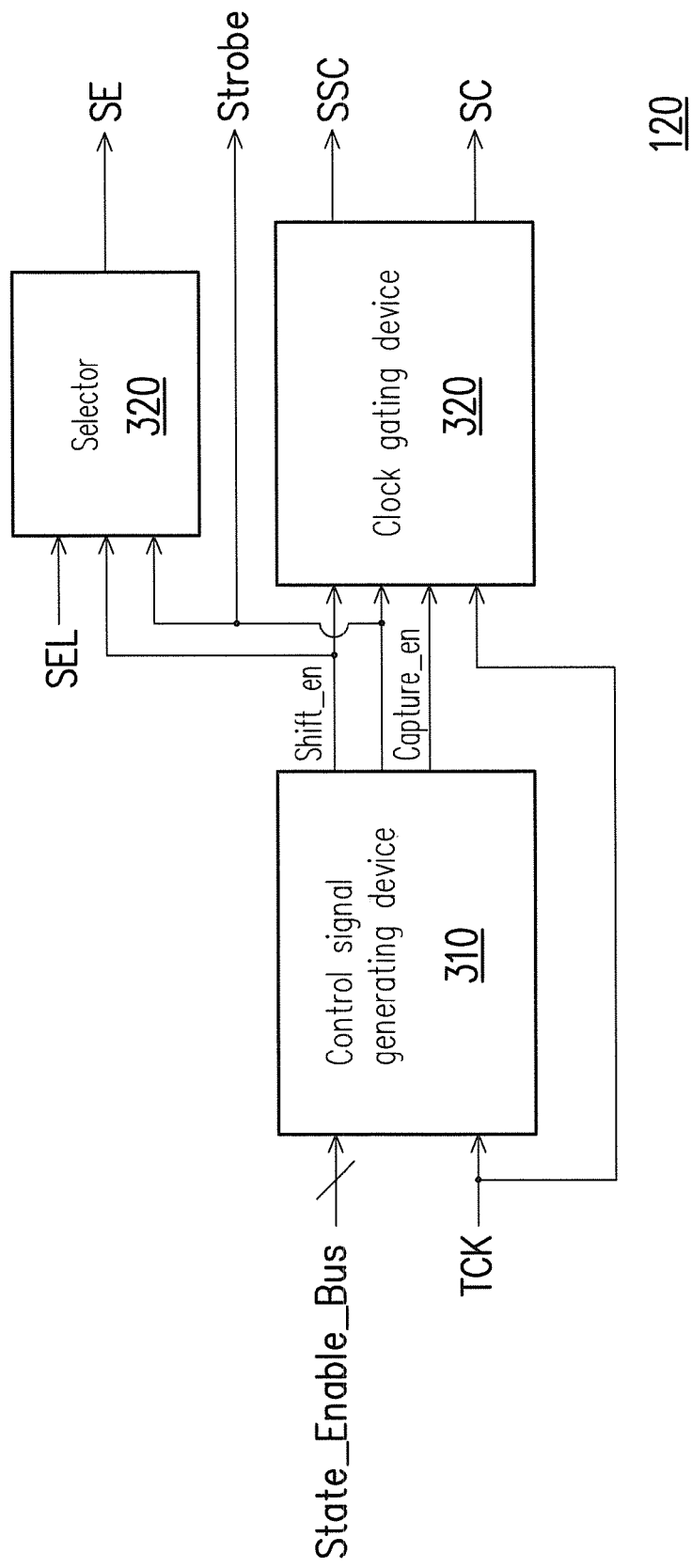
FIG. 19 illustrates a serialized compressed scan signal generator of FIG. 18 according to an embodiment of the disclosure.

FIG. 19 illustrates a serialized compressed scan signal generator 120 of FIG. 18 according to an embodiment of the disclosure. The serialized compressed scan signal generator 120 includes a control signal generating device 310, a clock gating device 320 and a selector 330. The control signal generating device 310 and the clock gating device 320 of the serialized compressed scan signal generator 120 of FIG. 19 may be implemented with reference to FIG. 3. The control signal generating device 310 could generate an shift enable signal Shift_en, a strobe signal Strobe and a capture enable signal Capture_en according to the test clock signal TCK, the optional test reset signal TRST and the state enable bus State_Enable_Bus from the controller 130 of FIG. 18. The clock gating device 320 is a logic circuit and generates a serialized scan clock signal SSC and a scan clock signal SC according to the enable signal Shift_en, the strobe signal Strobe, the capture enable signal Capture_en and the test clock signal TCK. Then, the selector 330 could selectively set the enable signal Shift_en or the strobe signal Strobe as a shift enable signal SE according to a selection signal SEL. Therefore, according to the state enable signal on the state enable bus State_Enable_Bus, the optional test reset signal TRST and the test clock signal TCK, the serialized compressed scan signal generator 120 could generate the serialized scan clock signal SSC, the shift enable signal SE, the strobe signal Strobe and the scan clock signal SC.

Figure 20:
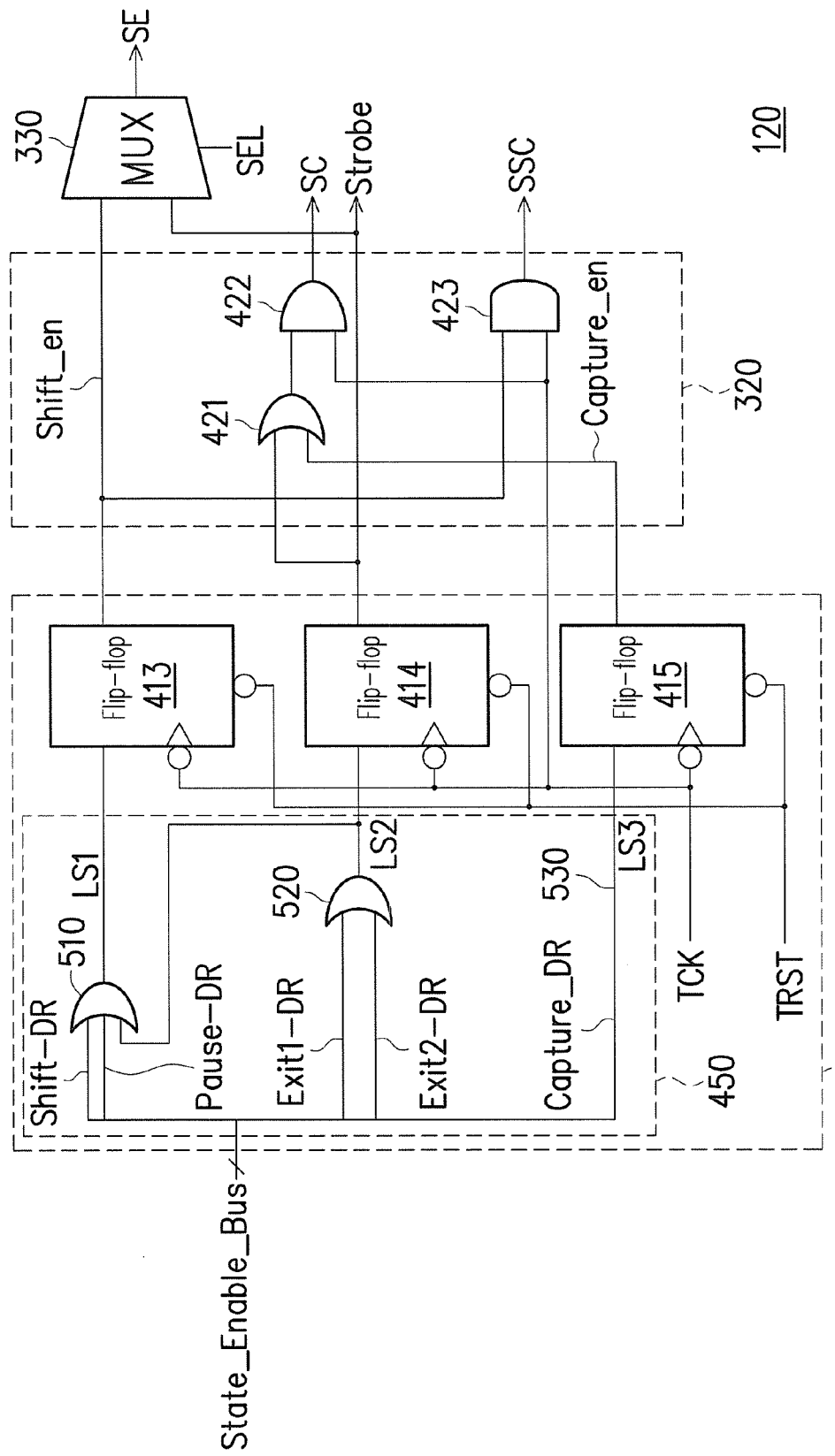
FIG. 20 illustrates a serialized compressed scan signal generator of FIG. 19 according to another embodiment of the disclosure.

FIG. 20 illustrates a serialized compressed scan signal generator 120 of FIG. 19 according to another embodiment of the disclosure. The serialized compressed scan signal generator 120 includes a control signal generating device 310, a clock gating device 320 and a selector 330. The control signal generating device 310 comprises OR gates 510 and 520 and negative edge-triggered registers 413-415. In the present embodiment, the negative edge-triggered registers 413-415 may be flip-flops (FFs). In FIG. 20, the clock gating device 320 includes an OR gate 421, an AND gate 422 and an AND gate 423. The control signal generating device 310 and the clock gating device 320 of the serialized compressed scan signal generator 120 of FIG. 20 may be implemented with reference to FIG. 3, FIG. 4, FIG. 5 and FIG. 6. The first input terminal of the selector 330 is coupled to the control signal generating device 310 for receiving the enable signal Shift_en. The second input terminal of the selector 330 is coupled to the control signal generating device 310 for receiving the strobe signal Strobe. The output terminal of the selector 330 could selectively provide the enable signal Shift_en or the strobe signal Strobe to serve as the shift enable signal SE according to the selection signal SEL. In the present embodiment, the selector 330 is a multiplexer. In other embodiment, the selector 330 may be a switch, a routing circuit or other. In the present embodiment of FIG. 20, the optional test reset signal TRST could be used to reset the negative edge-triggered registers 413-415. The signal waveform of the serialized compressed scan signal generator 120 of FIG. 20 may be implemented with reference to FIG. 8.

Figure 21:
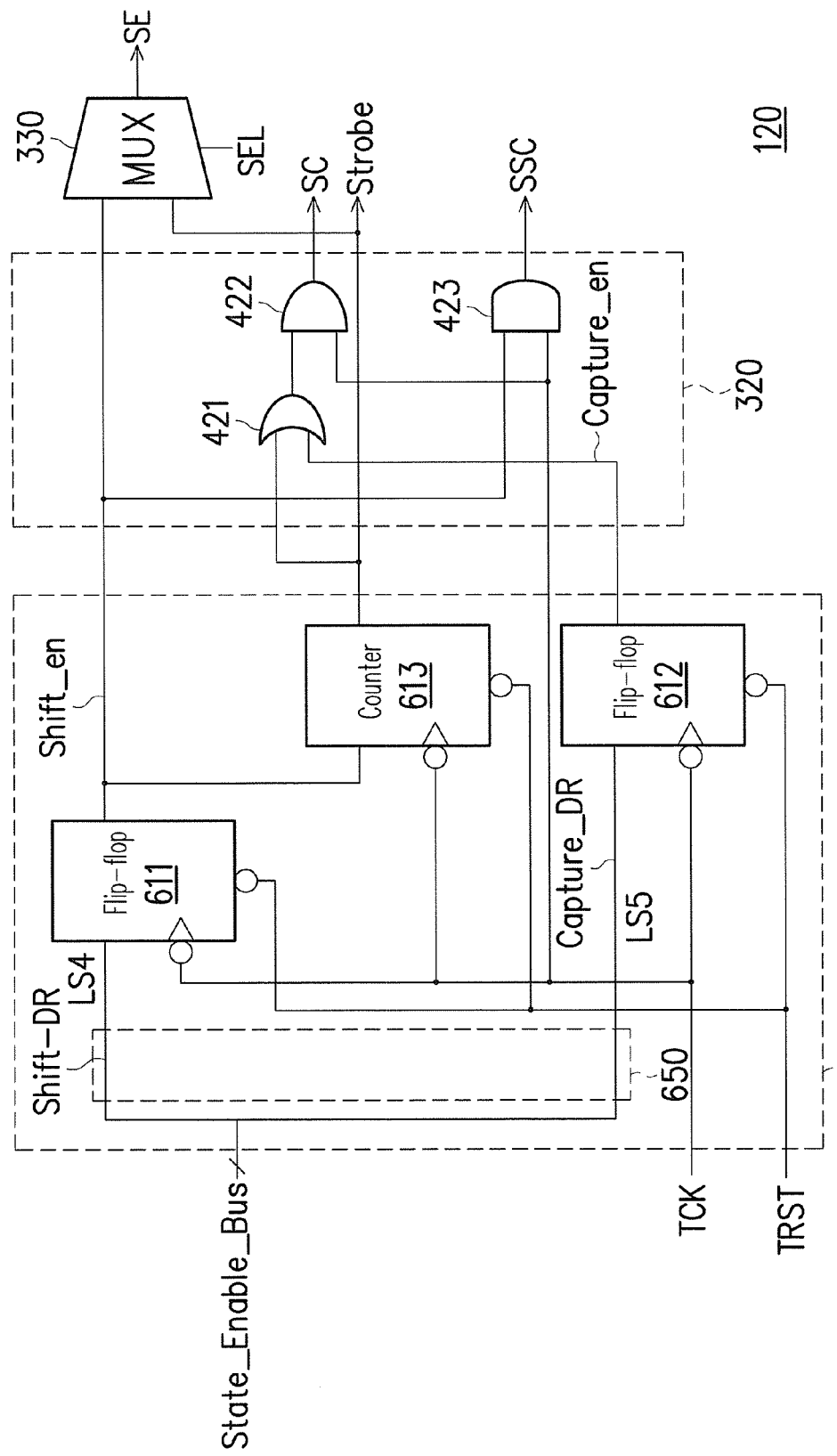
FIG. 21 illustrates a serialized compressed scan signal generator of FIG. 19 according to another embodiment of the disclosure.

FIG. 21 illustrates a serialized compressed scan signal generator 120 of FIG. 19 according to another embodiment of the disclosure. The control signal generating device 310 and the clock gating device 320 of the serialized compressed scan signal generator 120 of FIG. 21 may be implemented with reference to FIG. 3, FIG. 6, FIG. 11 and FIG. 12. The serialized compressed scan signal generator 120 includes a control signal generating device 310, a clock gating device 320 and a selector 330. The control signal generating device 310 includes negative edge-triggered registers 611 and 612 and a counter 613. In the present embodiment, the negative edge-triggered registers 611 and 612 may be flip-flops (FFs), and the counter 613 is a negative edge-triggered counter. In the present embodiment, the optional test reset signal TRST could be used to reset the negative edge-triggered registers 611-612 and the counter 613. The counter 613 could count a number of negative edges of the test clock signal TCK that the enable signal Shift_en remains enabled, and generates a counting result CNT. When the counting result CNT of the counter 613 is equivalent to the bit length of the deserializer (for example, the deserializer 112 of FIG. 1) or the serializer (for example, the serializer 113 of FIG. 1), the counter 613 enables the strobe signal Strobe. For example, it is assumed that the maximum bit length of the deserializer or the serializer is N, when the enable signal Shift_en is enabled, the counter 613 starts to count from an initial value (for example, CNT=0). When the counting result CNT of the counter 613 is N, the counter 613 enables the strobe signal Strobe, and sets the counting result CNT to 1, and continues to count from 1 to N until the enable signal Shift_en is disabled. When the shift enable signal Shift_en is disabled, the counter 613 is reset to the initial value CNT=0 to finish the counting process. In the present embodiment, the counter 613 performs a cyclic counting from 1 to N. In other embodiments, the counter 613 could perform the cyclic counting from a first value to a second value, where a difference of the second value and the first value is the bit length of the serializer or the deserializer minus one (i.e. N−1). The signal waveform of the serialized compressed scan signal generator 120 of FIG. 21 may be implemented with reference to FIG. 13.

Figure 22:
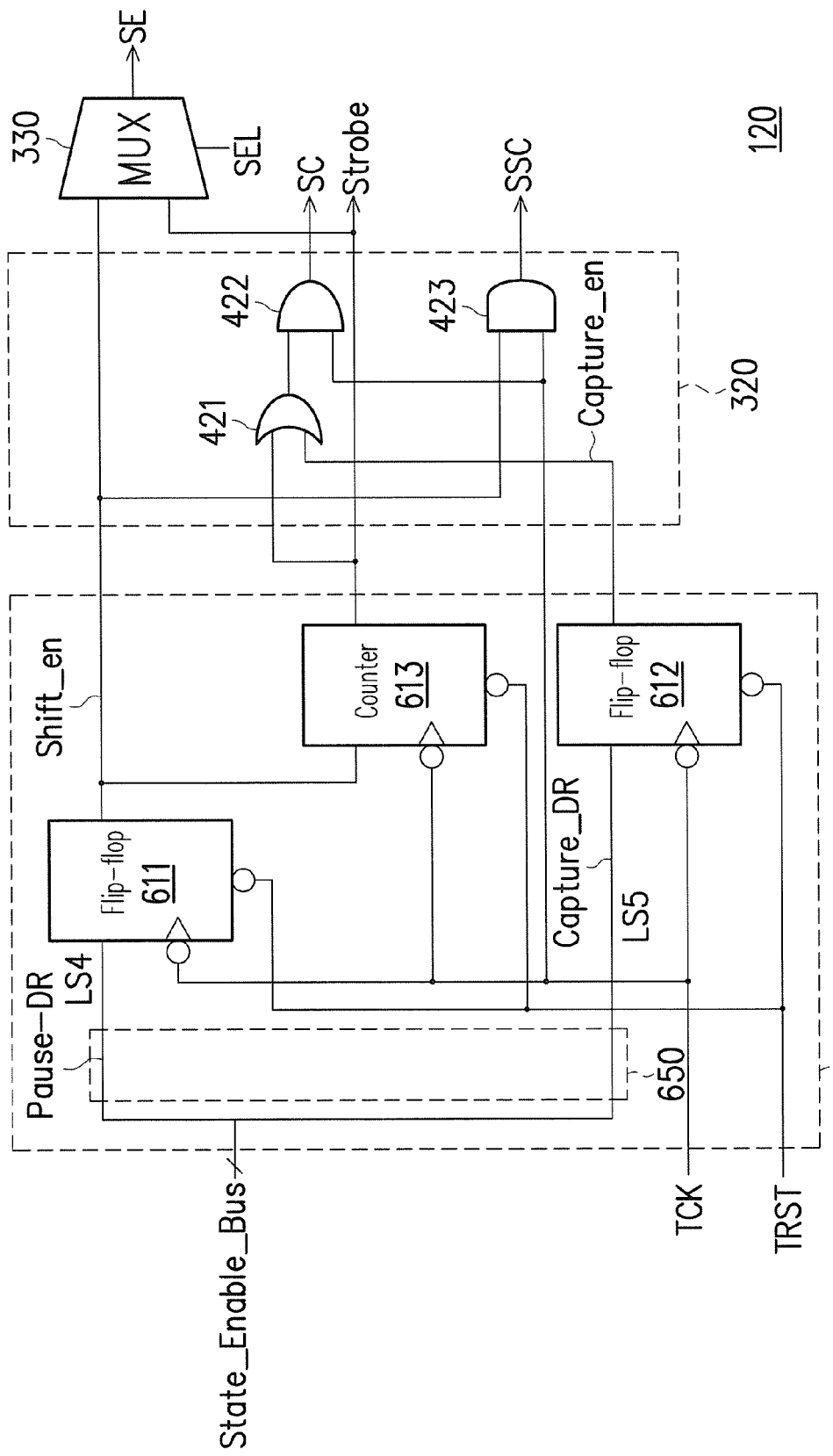
FIG. 22 illustrates a serialized compressed scan signal generator of FIG. 19 according to another embodiment of the disclosure.

FIG. 22 illustrates a serialized compressed scan signal generator 120 of FIG. 19 according to another embodiment of the disclosure. The control signal generating device 310 and the clock gating device 320 of the serialized compressed scan signal generator 120 of FIG. 22 may be implemented with reference to FIG. 3, FIG. 6, FIG. 11 and FIG. 14. The serialized compressed scan signal generator 120 includes a control signal generating device 310, the clock gating device 320 and the selector 330. The control signal generating device 310 includes negative edge-triggered registers 611 and 612 and a counter 613. Compared to the control signal generating device 310 of FIG. 21, the control signal generating device 310 of FIG. 22 enables the enable signal Shift_en according to the pause-DR state enable signal Pause-DR on the state enable bus State_Enable_Bus. For example, when the test clock signal TCK is at negative edge, the negative edge-triggered register 611 enables the enable signal Shift_en coupled to the counter 613, the clock gating device 320 and the selector 330 while the pause-DR state enable signal Pause-DR is enabled. The signal waveform of the serialized compressed scan signal generator 120 of FIG. 22 may be implemented with reference to FIG. 15.

Figure 23:
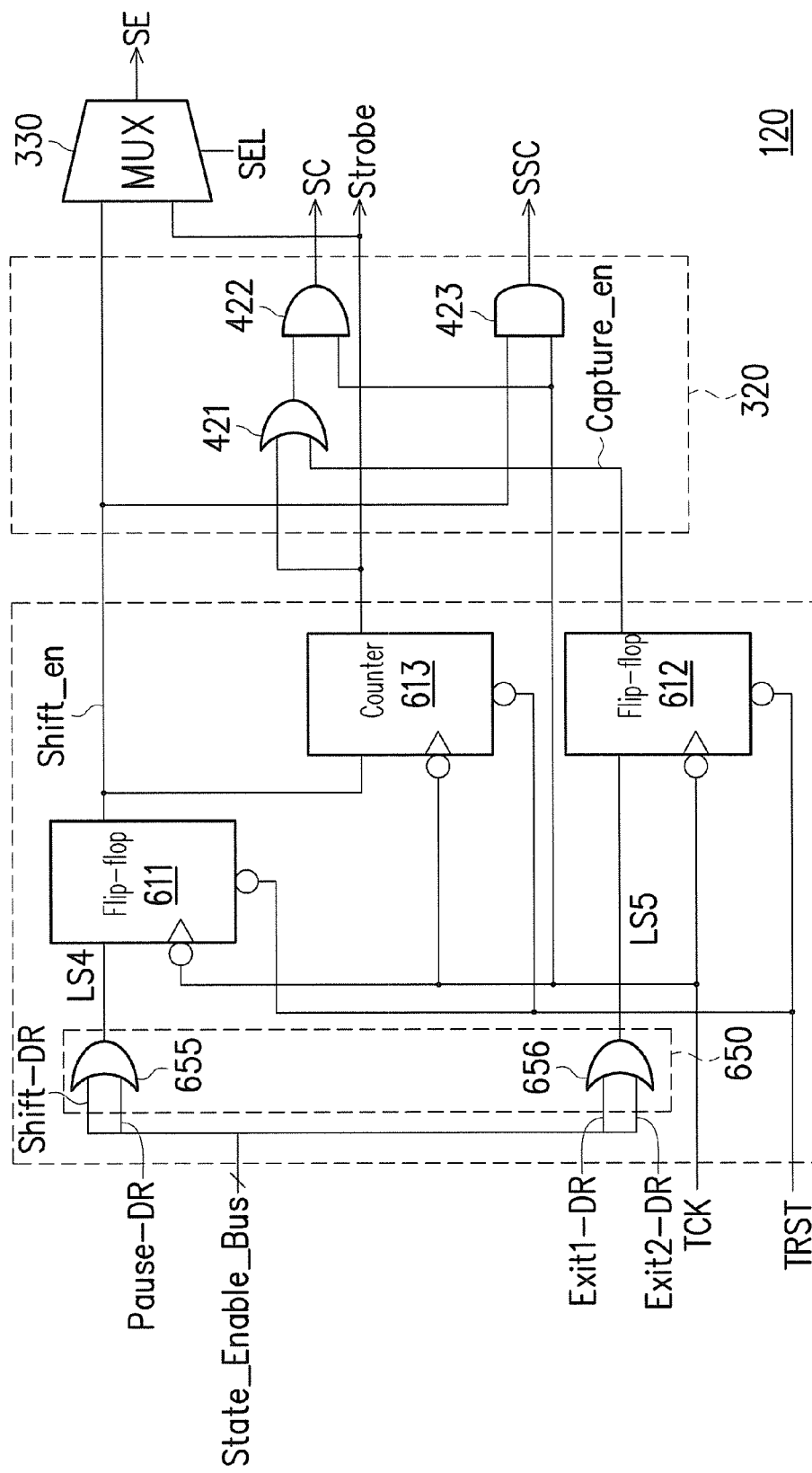
FIG. 23 illustrates a serialized compressed scan signal generator of FIG. 19 according to another embodiment of the disclosure.

FIG. 23 illustrates a serialized compressed scan signal generator 120 of FIG. 19 according to another embodiment of the disclosure. The control signal generating device 310 and the clock gating device 320 of the serialized compressed scan signal generator 120 of FIG. 23 may be implemented with reference to FIG. 3, FIG. 6, FIG. 11 and FIG. 16. The serialized compressed scan signal generator 120 includes a control signal generating device 310, the clock gating device 320 and the selector 330. The control signal generating device 310 includes negative edge-triggered registers 611 and 612, a counter 613 and OR gates 655 and 656. In the present embodiment, the OR gate 655 generates a signal LS4 according to the shift-DR state enable signal Shift-DR or the pause-DR state enable signal Pause-DR on the state enable bus State_Enable_Bus. When the test clock signal TCK is at negative edge, the negative edge-triggered register 611 generates the enable signal Shift_en to the clock gating device 320 and the selector 330 according to the signal LS4. The OR gate 656 generates a signal LS5 according to the exit1-DR state enable signal Exit1-DR or the exit2-DR state enable signal Exit2-DR on the state enable bus State_Enable_Bus. When the test clock signal TCK is at negative edge, the negative edge-triggered register 612 enables the capture enable signal Capture_en coupled to the clock gating device 320 according to the input signal LS5. The signal waveform of the serialized compressed scan signal generator 120 of FIG. 23 may be implemented with reference to FIG. 17.

Figure 24:
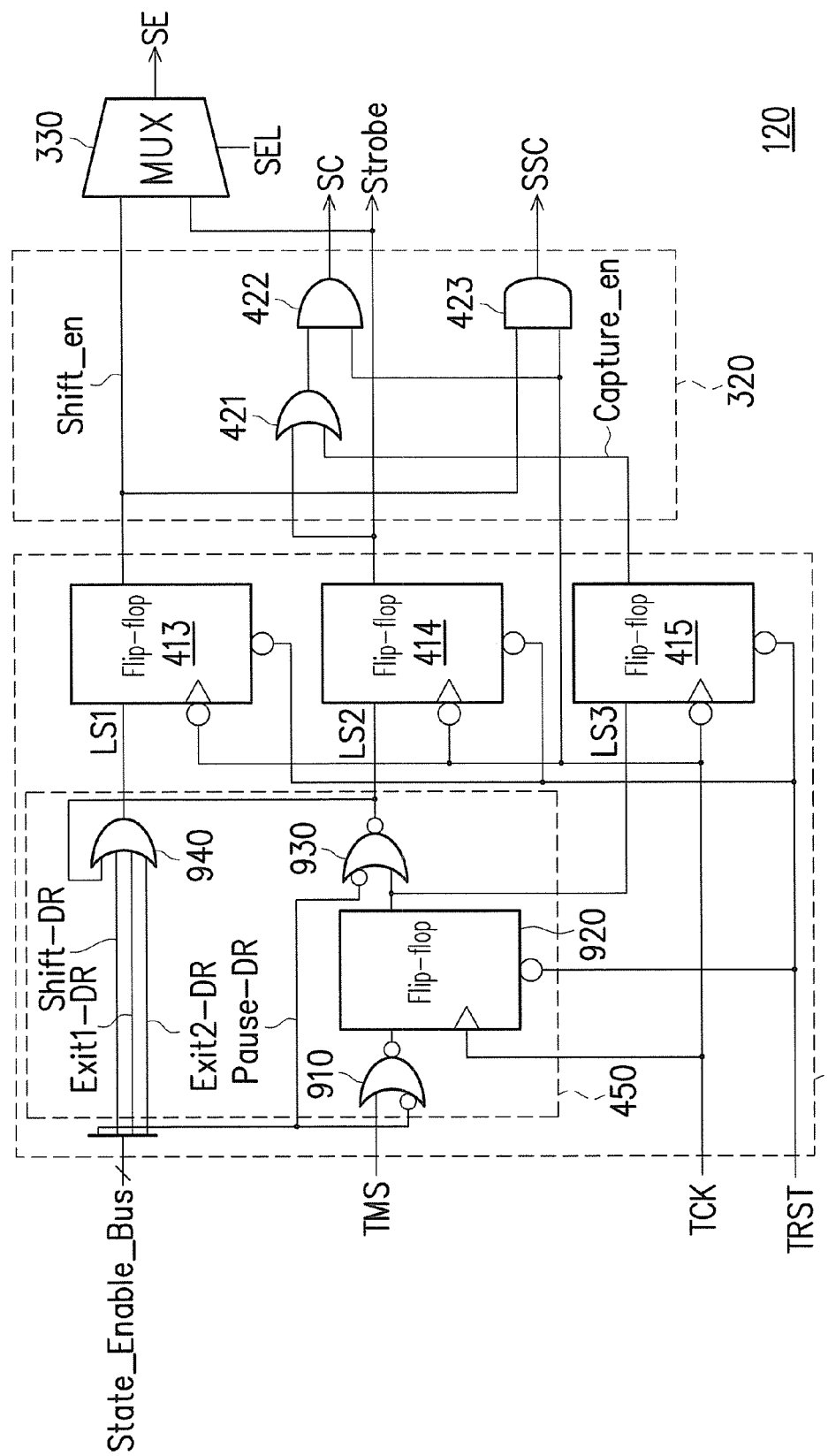
FIG. 24 illustrates a serialized compressed scan signal generator of FIG. 19 according to another embodiment of the disclosure.

FIG. 24 illustrates a serialized compressed scan signal generator 120 of FIG. 19 according to another embodiment of the disclosure. The control signal generating device 310 and the clock gating device 320 of the serialized compressed scan signal generator 120 of FIG. 24 may be implemented with reference to FIG. 3, FIG. 4, FIG. 6 and FIG. 9. The serialized compressed scan signal generator 120 includes a control signal generating device 310, the clock gating device 320 and the selector 330. The control signal generating device 310 includes NOR gates 910 and 930, an OR gate 940, flip-flop 920 and negative edge-triggered registers 413-415. In the present embodiment, the flip-flop 920 is a positive edge-triggered register. The optional test reset signal TRST could be used to reset the flip-flop 920 and negative edge-triggered registers 413-415. When the test clock signal TCK is at positive edge, the flip-flop 920 latches and output the output signal of the NOR gates 910 to serve as the signal LS3. When the test clock signal TCK is at negative edge, the negative edge-triggered register 415 latches and output the signal LS3 to serve as the capture enable signal Capture_en. Moreover, a first input terminal of the NOR gate 930 couples to an inversion logic value of the pause-DR state enable signal Pause-DR on the state enable bus State_Enable_Bus, a second input terminal of the NOR gate 930 couples to the signal LS3, and an output terminal of the NOR gate 930 couples to a data input terminal of the negative edge-triggered register 414 and a first input terminal of the OR gate 940. When the test clock signal TCK is at negative edge, the negative edge-triggered register 414 latches and output the signal LS2 to serve as the strobe signal Strobe. A second input terminal of the OR gate 940 couples to the shift-DR state enable signal Shift-DR on the state enable bus State_Enable_Bus, a third input terminal of the OR gate 940 couples to the exit1-DR state enable signal Exit1-DR on the state enable bus State_Enable_Bus, a fourth input terminal of the OR gate 940 couples to the exit2-DR state enable signal Exit2-DR on the state enable bus State_Enable_Bus, and an output terminal of the OR gate 940 output the signal LS1 to a data input terminal of the negative edge-triggered register 413. When the test clock signal TCK is at negative edge, the negative edge-triggered register 413 latches and outputs the signal LS 1 to serve as the enable signal Shift_en. The signal waveform of the serialized compressed scan signal generator 120 of FIG. 24 may be implemented with reference to FIG. 10.

The serialized compressed scan signal generator of the disclosure is suitable for integrating a test circuit of an integrated circuit, and is capable of converting a signal of the TAP into a signal required by the serialized compressed scan test, i.e. the serialized compressed scan test is performed through an IEEE1149.1 compliant TAP controller. When the serialized compressed scan test is performed, the serialized compressed scan signal generator of the disclosure generates a test control signal required by a serialized compressed scan test circuit, so as to generate continuous and uninterrupted serialized scan clock signals and scan clock signals to control the serialized compressed scan test circuit. Therefore, a process of transmitting the test data input to the scan chains through the deserializer and a process of transmitting the test result captured from the scan chains to the serializer are all uninterrupted. Therefore, a test interface conversion circuit design of non-loss or high conversion rate and an operation method thereof are provided.

According to the embodiments of the disclosure, by executing the test interface signal conversion, the serialized compressed scan signal generator 120 could be controlled through the TAP of the boundary scan test to generate the signal required by the serialized compressed scan signal test, so as to perform the serialized compressed test through a boundary scan circuit. Therefore, the test time, the test data volume and the number of test pins of the chip could be reduced which results to the test cost decreased, and the process of test integration for an IC is also improved.

It will be apparent to those skilled in the art that various modifications and variations could be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An integrated circuit device, configured to generate input control signals of a serialized compressed scan circuit, comprising:
   a clock input port, configured to receive a test clock signal;
   a state enable bus, configured to receive at least one state enable signal;
   a control signal generating device, coupled to the state enable bus for receiving the state enable signal, coupled to the clock input port for receiving the test clock signal, and correspondingly generating a shift enable signal, a capture enable signal and a strobe signal; and
   a clock gating device, coupled to the control signal generating device for receiving the shift enable signal, the capture enable signal and the strobe signal, and coupled to the clock input port for receiving the test clock signal, wherein the clock gating device, in responding to the test clock signal, generates a serialized scan clock signal when the shift enable signal is enabled and generates a scan clock signal when the strobe signal or the capture enable signal is enabled, wherein the serialized scan clock signal and the scan clock signal are part of the input control signals.

2. The integrated circuit device as claimed in claim 1, wherein the control signal generating device comprises:
- a logic operation circuit, coupled to the state enable bus for receiving an exit1-data-register state enable signal, an exit2-data-register state enable signal, a shift-data-register state enable signal, a pause-data-register state enable signal and a capture-data-register state enable signal, and correspondingly generating a first logic signal, a second logic signal and a third logic signal;
- a first negative edge-triggered register, having an input terminal coupled to the logic operation circuit for receiving the first logic signal, a negative edge-triggered terminal coupled to the clock input port for receiving the test clock signal, and an output terminal coupled to the clock gating device for providing the shift enable signal;
- a second negative edge-triggered register, having an input terminal coupled to the logic operation circuit for receiving the second logic signal, a negative edge-triggered terminal coupled to the clock input port for receiving the test clock signal, and an output terminal coupled to the clock gating device for providing the strobe signal; and
- a third negative edge-triggered register, having an input terminal coupled to the logic operation circuit for receiving the third logic signal, a negative edge-triggered terminal coupled to the clock input port for receiving the test clock signal, and an output terminal coupled to the clock gating device for providing the capture enable signal.

3. The integrated circuit device as claimed in claim 2, wherein the first logic signal is enabled when the exit1-data-register state enable signal, the exit2-data-register state enable signal, the shift-data-register state enable signal or the pause-data-register state enable signal is enabled,
wherein the second logic signal is enabled when the exit1-data-register state enable signal or the exit2-data-register state enable signal is enabled, and
wherein the third logic signal is enabled when the capture-data-register state enable signal is enabled.

4. The integrated circuit device as claimed in claim 3, wherein the logic operation circuit comprises:
- a first OR gate having a first input terminal coupled to the state enable bus for receiving the shift-data-register state enable signal, a second input terminal coupled to the state enable bus for receiving the pause-data-register state enable signal, and an output terminal generating the first logic signal to the input terminal of the first negative edge-triggered register;
- a second OR gate having a first input terminal coupled to the state enable bus for receiving the exit1-data-register state enable signal, a second input terminal coupled to the state enable bus for receiving the exit2-data-register state enable signal, and an output terminal coupled to a third input terminal of the first OR gate and generating the second logic signal to the input terminal of the second negative edge-triggered register; and
- a wire having a first terminal coupled to the state enable bus for receiving the capture-data-register state enable signal, and a second terminal outputting the capture-data-register state enable signal to serve as the third logic signal.

5. The integrated circuit device as claimed in claim 2, wherein the logic operation circuit comprises:
- a first NOR gate having an inverting input terminal coupled to the state enable bus for receiving the pause-data-register state enable signal, and a non-inverting input terminal configured to receive a test mode selection signal;
- a flip-flop having an input terminal coupled to an output terminal of the first NOR gate, a positive edge-triggered terminal coupled to the clock input port for receiving the test clock signal, and an output terminal providing the third logic signal to the third negative edge-triggered register;
- a second NOR gate having an inverting input terminal coupled to the state enable bus for receiving the pause-data-register state enable signal, a non-inverting input terminal coupled to the output terminal of the flip-flop, and an output terminal providing the second logic signal to the second negative edge-triggered register; and
- an OR gate having a first input terminal coupled to the output terminal of the second NOR gate, a second input terminal coupled to the state enable bus for receiving the shift-data-register state enable signal, a third input terminal coupled to the state enable bus for receiving the exit1-data-register state enable signal, a fourth input terminal coupled to the state enable bus for receiving the exit2-data-register state enable signal, and an output terminal providing the first logic signal to the first negative edge-triggered register.

6. The integrated circuit device as claimed in claim 2, wherein the first negative edge-triggered register, the second negative edge-triggered register and the third negative edge-triggered register are reset by an optional test reset signal.

7. The integrated circuit device as claimed in claim 1, wherein the control signal generating device comprises:
- a logic operation circuit, coupled to the state enable bus for receiving the at least one state enable signal, and correspondingly generating a first logic signal and a second logic signal;
- a first negative edge-triggered register, having an input terminal coupled to the logic operation circuit for receiving the first logic signal, a negative edge-triggered terminal coupled to the clock input port for receiving the test clock signal, and an output terminal coupled to the clock gating device for providing the shift enable signal;
- a second negative edge-triggered register, having an input terminal coupled to the logic operation circuit for receiving the second logic signal, a negative edge-triggered terminal coupled to the clock input port for receiving the test clock signal, and an output terminal coupled to the clock gating device for providing the capture enable signal; and
- a negative edge-triggered counter, having an input terminal coupled to the output terminal of the first negative edge-triggered register for receiving the shift enable signal, a negative edge-triggered terminal coupled to the clock input port for receiving the test clock signal, and an output terminal coupled to the clock gating device for providing the strobe signal, wherein cyclic counting of the negative edge-triggered counter from a first value to a second value is activated when the shift enable signal is enabled and the test clock signal is at negative edge.

8. The integrated circuit device as claimed in claim 7, wherein the negative edge-triggered counter is reset to an initial value when the shift enable signal is disabled, and a difference between the second value and the first value is a serializer bit length minus one or a deserializer bit length minus one.

9. The integrated circuit device as claimed in claim 7, wherein the logic operation circuit comprises:
a first OR gate having a first input terminal coupled to the state enable bus for receiving a shift-data-register state enable signal, a second input terminal coupled to the state enable bus for receiving a pause-data-register state enable signal, and an output terminal generating the first logic signal to the input terminal of the first negative edge-triggered register; and
a second OR gate having a first input terminal coupled to the state enable bus for receiving an exit1-data-register state enable signal, a second input terminal coupled to the state enable bus for receiving an exit2-data-register state enable signal, and an output terminal generating the second logic signal to the input terminal of the second negative edge-triggered register.

10. The integrated circuit device as claimed in claim 7, wherein the logic operation circuit comprises:
a first wire having a first terminal coupled to the state enable bus for receiving a shift-data-register state enable signal, and a second terminal outputting the shift-data-register state enable signal to serve as the first logic signal; and
a second wire having a first terminal coupled to the state enable bus for receiving a capture-data-register state enable signal, and a second terminal outputting the capture-data-register state enable signal to serve as the second logic signal.

11. The integrated circuit device as claimed in claim 7, wherein the logic operation circuit comprises:
a first wire having a first terminal coupled to the state enable bus for receiving a pause-data-register state enable signal, and a second terminal outputting the pause-data-register state enable signal to serve as the first logic signal; and
a second wire having a first terminal coupled to the state enable bus for receiving a capture-data-register state enable signal, and a second terminal outputting the capture-data-register state enable signal to serve as the second logic signal.

12. The integrated circuit device as claimed in claim 7, wherein the first negative edge-triggered register, the second negative edge-triggered register and the negative edge-triggered counter are reset by an optional test reset signal.

13. The integrated circuit device as claimed in claim 1, wherein the clock gating device comprises:
an OR gate having a first input terminal coupled to the control signal generating device for receiving the strobe signal, and a second input terminal coupled to the control signal generating device for receiving the capture enable signal;
a first AND gate having a first input terminal coupled to an output terminal of the OR gate, a second input terminal coupled to the clock input port for receiving the test clock signal, and an output terminal generating the scan clock signal to the serialized compressed scan circuit; and
a second AND gate having a first input terminal coupled to the control signal generating device for receiving the shift enable signal, a second input terminal coupled to the clock input port for receiving the test clock signal, and an output terminal generating the serialized scan clock signal to the serialized compressed scan circuit.

14. The integrated circuit device as claimed in claim 1, further comprising:
a selector having a first input terminal coupled to the control signal generating device for receiving the shift enable signal, a second input terminal coupled to the control signal generating device for receiving the strobe signal, and an output terminal outputting the shift enable signal or the strobe signal to the serialized compressed scan circuit.

15. The integrated circuit device as claimed in claim 14, wherein the selector comprises a multiplexer.

16. The integrated circuit device as claimed in claim 1, further comprising:
a controller, coupled to the state enable bus for providing the at least one state enable signal.

17. The integrated circuit device as claimed in claim 16, wherein the controller is a test access port (TAP) controller with a TAP state machine, and the at least one state enable signal is (are) generated by the TAP state machine which compliant to IEEE 1149.1 standard.

18. A method for generating input control signals of a serialized compressed scan circuit, comprising:
generating a shift enable signal, a capture enable signal and a strobe signal according to at least one state enable signal transmitted from a state enable bus and a test clock signal transmitted from a clock input port;
generating a serialized scan clock signal when the shift enable signal is enabled and generating a scan clock signal when the strobe signal or the capture enable signal is enabled in responding to the test clock signal transmitted from the clock input port,
wherein the serialized scan clock signal and the scan clock signal are part of the input control signals.

19. The method as claimed in claim 18, wherein the step of generating a shift enable signal, a capture enable signal and a strobe signal comprises:
generating a first logic signal, a second logic signal and a third logic signal according to an exit1-data-register state enable signal, an exit2-data-register state enable signal, a shift-data-register state enable signal, a pause-data-register state enable signal and a capture-data-register state enable signal transmitted from the state enable bus;
latching the first logic signal according to the test clock signal, so as to provide the shift enable signal;
latching the second logic signal according to the test clock signal, so as to provide the strobe signal; and
latching the third logic signal according to the test clock signal, so as to provide the capture enable signal.

20. The method as claimed in claim 19, wherein the step of generating a first logic signal, a second logic signal and a third logic signal comprises:
enabling the first logic signal when the exit1-data-register state enable signal, the exit2-data-register state enable signal, the shift-data-register state enable signal or the pause-data-register state enable signal is enabled;
enabling the second logic signal when the exit1-data-register state enable signal or the exit2-data-register state enable signal is enabled; and
enabling the third logic signal when the capture-data-register state enable signal is enabled.

21. The method as claimed in claim 19, wherein the step of generating a first logic signal, a second logic signal and a third logic signal comprises:
configuring a first NOR gate having an inverting input terminal and a non-inverting input terminal, wherein the inverting input terminal of the first NOR gate is coupled to the state enable bus for receiving the pause-data-register state enable signal, and the non-inverting input terminal of the first NOR gate is configured to receive a test mode selection signal;

configuring a flip-flop having an input terminal, a positive edge-triggered terminal and an output terminal, wherein the input terminal of the flip-flop is coupled to an output terminal of the first NOR gate, the positive edge-triggered terminal of the flip-flop is coupled to the clock input port for receiving the test clock signal, and the output terminal of the flip-flop provides the third logic signal;

configuring a second NOR gate having an inverting input terminal, a non-inverting input terminal and an output terminal, wherein the inverting input terminal of the second NOR gate is coupled to the state enable bus for receiving the pause-data-register state enable signal, the non-inverting input terminal of the second NOR gate is coupled to the output terminal of the flip-flop, and the output terminal of the second NOR gate provides the second logic signal; and configuring an OR gate having a first input terminal, a second input terminal, a third input terminal, a fourth input terminal and an output terminal, wherein the first input terminal of the OR gate is coupled to the output terminal of the second NOR gate, the second input terminal of the OR gate is coupled to the state enable bus for receiving the shift-data-register state enable signal, the third input terminal of the OR gate is coupled to the state enable bus for receiving the exit1-data-register state enable signal, the fourth input terminal of the OR gate is coupled to the state enable bus for receiving the exit2-data-register state enable signal, and the output terminal of the OR gate provides the first logic signal.

22. The method as claimed in claim 18, wherein the step of generating a shift enable signal, a capture enable signal and a strobe signal comprises:
generating a first logic signal and a second logic signal according to the at least one state enable signal transmitted from the state enable bus;
latching the first logic signal according to the test clock signal, so as to provide the shift enable signal;
latching the second logic signal according to the test clock signal, so as to provide the capture enable signal; and
cyclic counting the test clock signal from a first value to a second value according to the shift enable signal, so as to provide the strobe signal.

23. The method as claimed in claim 22, wherein a difference between the second value and the first value is a serializer bit length minus one or a deserializer bit length minus one.

24. The method as claimed in claim 22, wherein the step of generating first logic signal and a second logic signal comprises:
enabling the first logic signal when a shift-data-register state enable signal transmitted from the state enable bus or a pause-data-register state enable signal transmitted from the state enable bus is enabled; and
enabling the second logic signal when an exit1-data-register state enable signal transmitted from the state enable bus or an exit2-data-register state enable signal transmitted from the state enable bus is enabled.

25. The method as claimed in claim 22, wherein the step of generating first logic signal and a second logic signal comprises:
enabling the first logic signal when a shift-data-register state enable signal transmitted from the state enable bus is enabled; and
enabling the second logic signal when a capture-data-register state enable signal transmitted from the state enable bus is enabled.

26. The method as claimed in claim 22, wherein the step of generating first logic signal and a second logic signal comprises:
enabling the first logic signal when a pause-data-register state enable signal transmitted from the state enable bus is enabled; and
enabling the second logic signal when a capture-data-register state enable signal transmitted from the state enable bus is enabled.

27. The method as claimed in claim 18, wherein the step of controlling the test clock signal as the scan clock signal comprises:
configuring an OR gate having a first input terminal and a second input terminal, wherein the first input terminal of the OR gate receives the strobe signal, and the second input terminal of the OR gate receives the capture enable signal; and
configuring a AND gate having a first input terminal, a second input terminal and an output terminal, wherein the first input terminal of the AND gate is coupled to an output terminal of the OR gate, the second input terminal of the AND gate receives the test clock signal, and the output terminal of the AND gate generates the scan clock signal to the serialized compressed scan circuit.

28. The method as claimed in claim 18, wherein the step of controlling the test clock signal as the serialized scan clock signal comprises:
configuring a AND gate having a first input terminal, a second input terminal and an output terminal, wherein the first input terminal of the AND gate receives the shift enable signal, the second input terminal of the AND gate receives the test clock signal, and the output terminal of the AND gate generates the serialized scan clock signal to the serialized compressed scan circuit.

29. The method as claimed in claim 18, further comprising:
selecting the shift enable signal or the strobe signal to the serialized compressed scan circuit.

30. The method as claimed in claim 18, wherein the at least one state enable signal is (are) generated by a test access port (TAP) controller with a TAP state machine which compliant to IEEE 1149.1 standard.

* * * * *